United States Patent [19]
Koifman et al.

[11] Patent Number: 5,790,063
[45] Date of Patent: Aug. 4, 1998

[54] ANALOG-TO-DIGITAL CONVERTER ON CMOS WITH MOS CAPACITOR

[75] Inventors: Vladimir Koifman, Rishon-Lezion; Yachin Afek, Kfar Saba; Israel Kashat, Netanya, all of Israel

[73] Assignee: Motorola, Inc., Schaumburg, Ill.

[21] Appl. No.: 767,052

[22] Filed: Dec. 16, 1996

[51] Int. Cl.⁶ .................................................. H03M 1/46
[52] U.S. Cl. ........................................ 341/155; 341/172
[58] Field of Search ................................ 341/155, 172, 341/142, 110, 163

[56] References Cited

U.S. PATENT DOCUMENTS

| | | | |
|---|---|---|---|
| 4,710,747 | 12/1987 | Holland | 341/120 |
| 4,764,753 | 8/1988 | Yukawa | 340/347 |
| 4,896,156 | 1/1990 | Garverick | 341/143 |
| 5,065,157 | 11/1991 | Ribner et al. | 341/143 |
| 5,323,157 | 6/1994 | Ledzius et al. | 341/143 |
| 5,408,235 | 4/1995 | Doyle et al. | 341/143 |

FOREIGN PATENT DOCUMENTS

| | | | |
|---|---|---|---|
| 5284033 | 10/1993 | Japan | H03M 3/02 |
| 2235599 | 3/1991 | United Kingdom | H03M 1/20 |

OTHER PUBLICATIONS

An 8-b 50-Mhz 225-mW Submicron CMOS ADC using saturation eliiminated comparators, IEEE 1990 Custom integrated circuits conference, Tatsuji Matsuura, Hirotsugu Kojima, Eiki Imaizumi, Kunihiko Usui and Seiichi Ueda, no month.

Full custom design of a 8-bit Subranging flash A/D convertor; J. Vanneuville, D. Gevaert, J. Sevenhans; Radioengineering vol. 2, no. 2, Jul. 1993.

A 10 bit 20 MS/s 3 V Supply CMOS A/D Convertor, M. Ito, T. Miki, S. Hosotani, T. Kumamoto, Y. Yamashita, M. Kijima, T. Okuda and K. Okada IEEE Journal of solid-state circuits, vol. 29, No. 12, Dec. 1994.

Primary Examiner—Marc S. Hoff
Assistant Examiner—Peggy Jean Pierre
Attorney, Agent, or Firm—Robert M. Handy

[57] ABSTRACT

An analog-to-digital converter is introduced which operates as an oversampled delta-sigma converter. The converter is implemented fully differentially, having doubled integrator capacitors (130, 230), comparators (180, 280), and feedback units (160, 260). In order to reduce the influence of parasitic capacities, the feedback units (160, 260) comprise cascoded switches (171-179). Internal auxiliary signals for controlling the feedback units (160, 260) return to zero at clock frequency. The converter can be used in an integrated signal processing circuit having analog and digital domains on one chip. The capacitors (130, 230) itself are implemented by MOS transistors with the same single poly process as the rest of the circuit. In a second embodiment of the invention, the analog-to-digital converter (500) comprises multiple comparators (580, 572, 573, 574), dynamic matching circuits (801, 802). The comparators (572, 573, 574) can received dithered input signals.

16 Claims, 12 Drawing Sheets

180

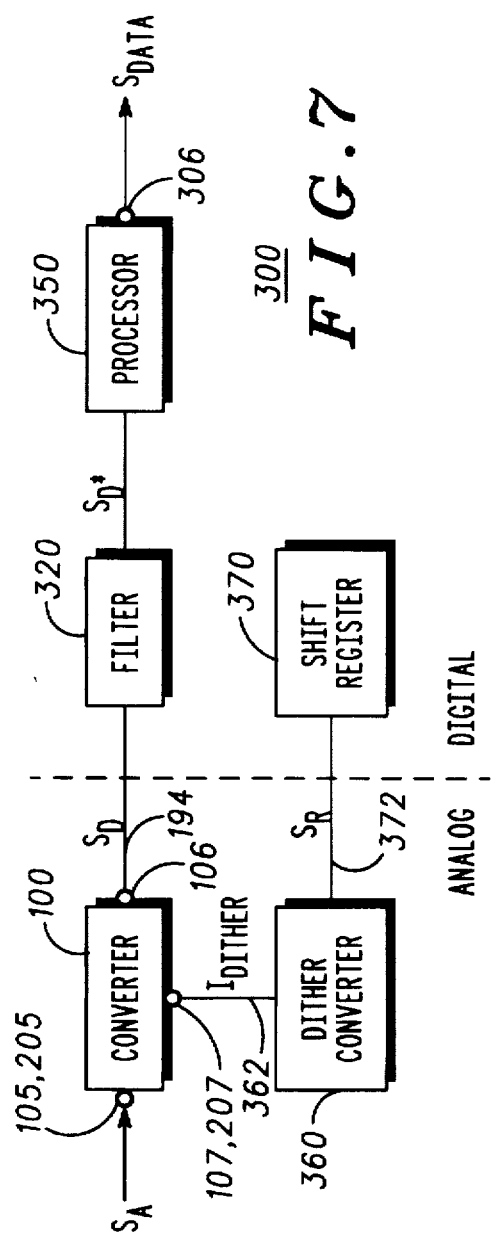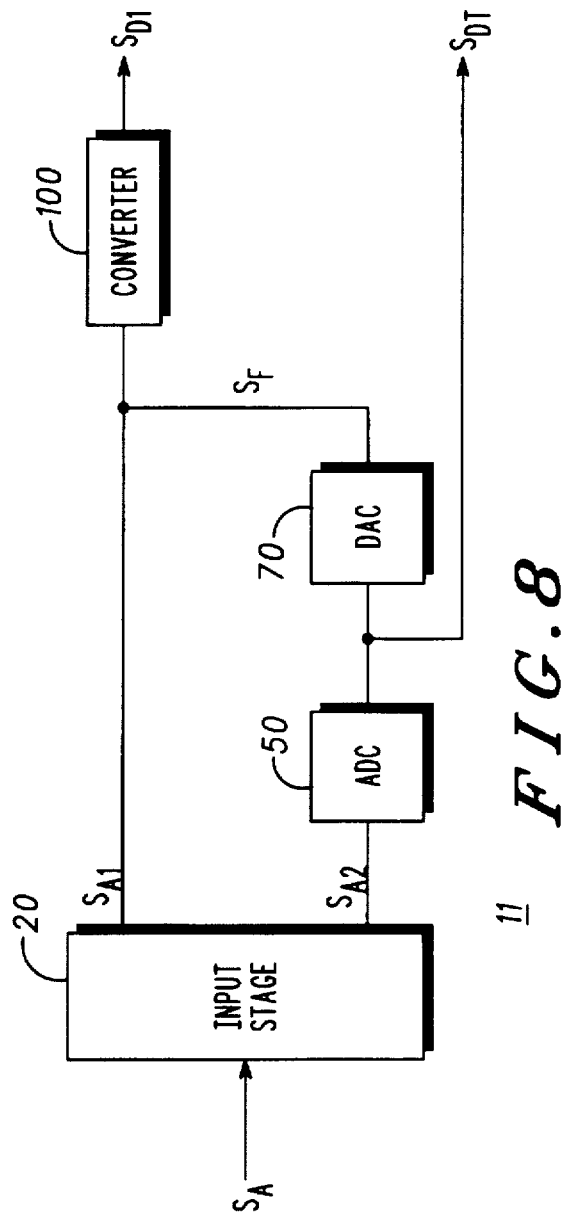

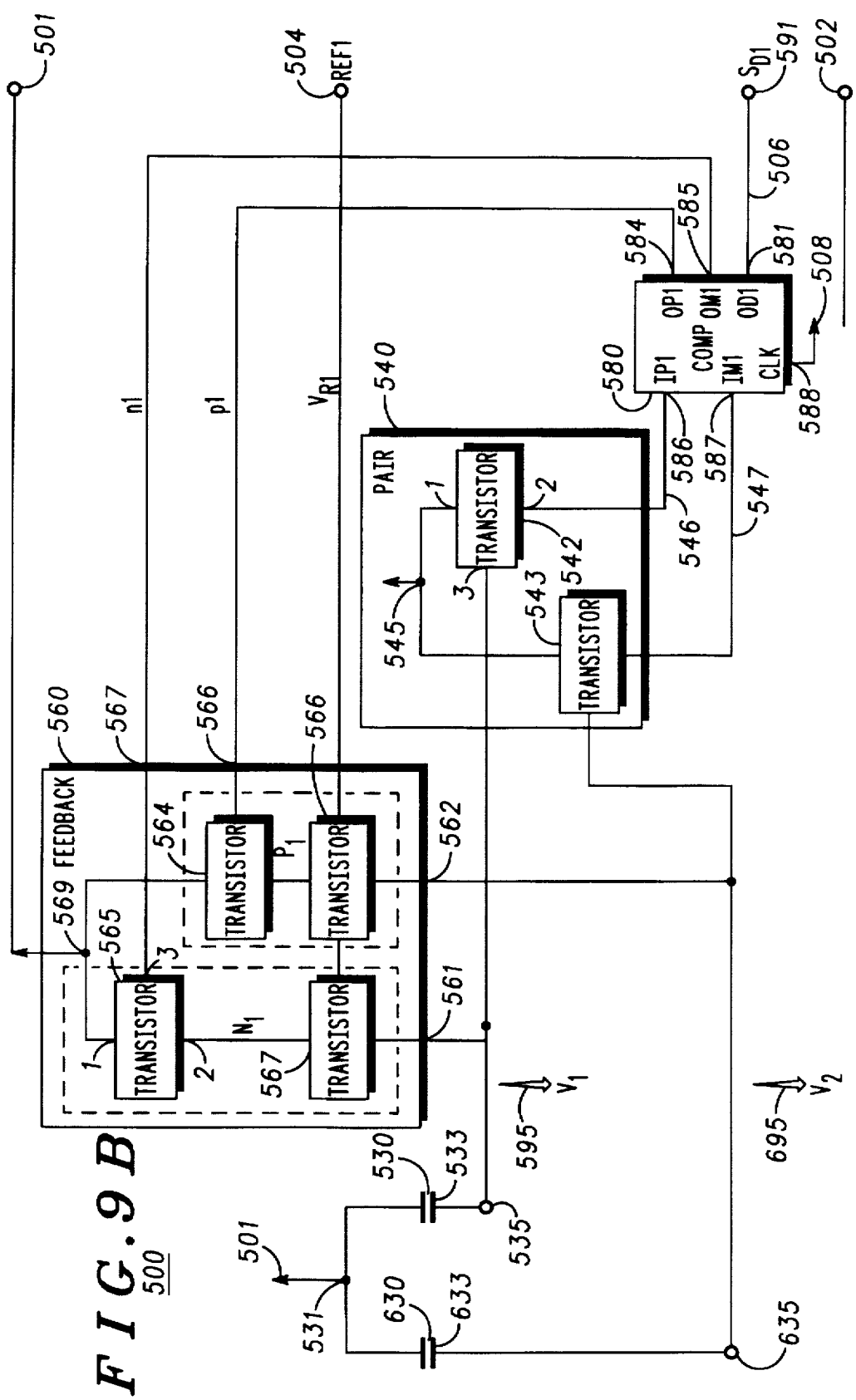

ANALOG-TO-DIGITAL CONVERTER ON CMOS WITH MOS CAPACITOR

CROSS REFERENCE TO RELATED APPLICATIONS

This application is related to patent applications entitled [1] "Linear Voltage-to-current Converter" filed on Aug. 12, 1996, Ser. No. 08/695,929, and [2] "Digital-to-analog Converter with Dynamic Matching and Bit Splitting" filed on August 23, Ser. No. 08/689,622, and assigned to the assignee hereof.

FIELD OF THE INVENTION

This invention relates in general to electronic devices for converting analog signals into digital signals and more particularly to integrated delta-sigma converters and to the conversion method.

BACKGROUND OF THE INVENTION

Monolithic integrated digital signal processing (DSP) circuits often include analog and digital domains. Analog-to-digital converters (ADCs) and digital-to-analog converters (DACs) are the interface between the domains and determine the overall performance of the DSP circuit. To reduce production costs, the manufacturing technology for analog and digital circuitry on the chip must be harmonized. Process steps which are only required in one domain, e.g., analog domain, must be simplified or replaced.

Medium accuracy analog-to-digital converters having 8 to 13 bit resolution can be integrated into DSP circuits using existing technology. Such analog-to-digital converters often operate as delta-sigma converters. They are also called noise-shaping converters or modulators.

As used herein, the term 'converter' is intended to include circuits which are used as an interface between analog and digital domains of, for example, a DSP chip. Such converters comprise analog-to-digital as well as digital-to-analog converters and are referred to by the abbreviations 'ADC' and 'DAC'.

FIG. 1 is a simplified schematic block diagram of delta-sigma converter 10, according to the prior art, for converting an analog signal $S_A$ into a digital signal $S_D$. The functional blocks of converter 10 are node 35, integrator 30, ADC 80, and DAC 60.

The analog signal $S_A$ is sent to integrator 30 via node 35. $S_A$ is integrated in integrator 30. ADC 80 is a comparator which compares the integrated form of $S_A$ to a reference signal $S_{REF}$. ADC 80 produces the digital signal $S_D$ which is related to the analog signal $S_A$. ADC 80 is controlled by the clock signal CLK. The clock frequency $f_{CLK}$ of CLK is higher than the signal frequency $f_S$ of $S_A$ and also higher than the Nyquist frequency $f_N=2*f_S$. DAC 60 is a feedback circuit which generates the analog feedback signal $S_F$. $S_F$ is negatively supplied to node 35 and presented to integrator 30. The analog signal $S_A$ is continuously integrated in integrator 30. Integrator 30 is discharged by the negative feedback. The digital signal $S_D$ is a 1-bit sequence (e.g., 1/0 or +1/−1) which represent the numerical value of $S_A$.

If integrator 30 is implemented by switched capacitors, these capacitors must be highly linear. Integrator 30 can be realized by a $SiO_2$ capacitor with two conducting electrodes. Such capacitors occur naturally in metal gate MOS technologies and in silicon gate technologies with two layers of polysilicon (double poly techniques). However, as is often the case, the digital domain of the DSP circuit does not require double poly techniques. In that situation, providing the capacities can involve extra costs since a double poly process has 10–15% higher costs than a single poly process. The digital domain of the DSP circuit is often larger than the analog domain. The implementation of a small double poly analog domain and a larger single poly digital domain into one DSP chip is often economically not justified.

ADC 80 and DAC 60 can be single-bit circuits. In that case, ADC 80 is a comparator and DAC 60 is a switching network. Parasitic capacities in, for example, DAC 60 discharge integrator 30. The time in which the digital signal $S_D$ remains at the same level varies. That can lead to quantization noise leakage. These effects are unwanted and require expensive countermeasures.

This invention seeks to provide an ADC and a A/D conversion method which mitigates or avoids the above mentioned and other disadvantages and limitations of the prior art.

BRIEF DESCRIPTION OF THE DRAWINGS

FIG. 7 is a simplified schematic diagram of a digital signal processing circuit incorporating the converter of FIG. 2;

FIG. 8 is a simplified schematic block diagram of a converter incorporating the converter of FIG. 2;

FIGS. 9A–B are simplified block diagrams illustrating a delta-sigma analog-to-digital converter according to a second embodiment of the present invention;

DESCRIPTION OF A PREFERRED EMBODIMENT

The invention provides an improved delta-sigma converter and an improved method for converting an analog signal $S_A$ into a digital signal $S_D$. The converter according to the invention is fully differential. Functional blocks, such as integrator, ADC, and DAC are doubled. The integrator comprises MOS transistors which can be manufactured in a single poly process. That allows the implementation of the converter into digital signal processing circuits without additional manufacturing steps, as compared to prior art solutions. The DAC in the feedback loop comprises cascoded switches. The influence of parasitic capacities can thereby be minimized. Preferably, the switches are controlled by auxiliary signals returning to zero at $f_{CLK}$ so that the leakage of quantization noise can be reduced. The analog signal $S_A$ can be supplied as a differential voltage $V_D$ or as a differential current $I_D$ having component currents $I_1$, and $I_2$. In the best mode embodiment, the converter has been implemented by CMOS technology. Compared to prior art, chip area and power consumption are reduced.

Figure 1:
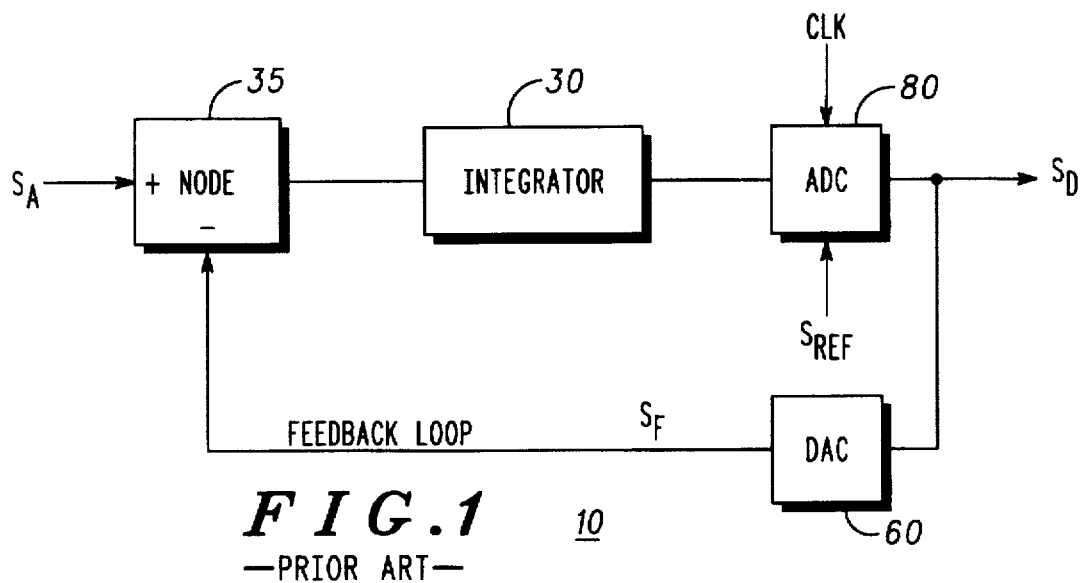
FIG. 1 is a simplified schematic block diagram of a delta-sigma converter, according to the prior art.
Figure 2:
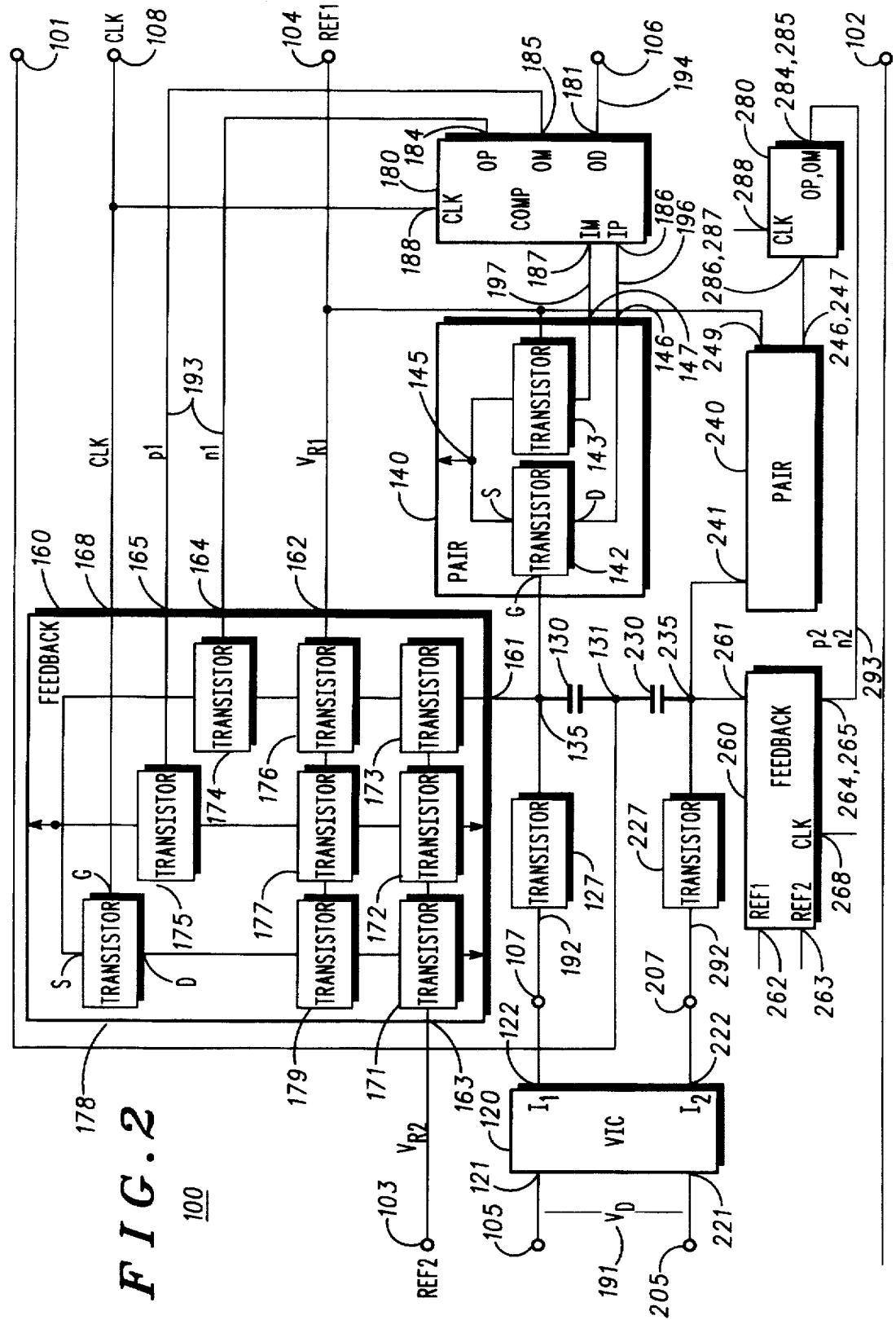
FIG. 2 is a simplified schematic block diagram of an analog-to-digital converter according to a first embodiment of the present invention.

FIG. 2 is a simplified schematic block diagram of analog-to-digital converter 100 (hereinafter converter 100) according to a first embodiment of the invention. Converter 100 comprises optional voltage-to-current converter (VIC) 120, first node 135, second node 235, first capacitor 130, second capacitor 230, differential transistor pairs 140, and 240, comparators 180 and 280, and feedback units 160 and 260. In comparison to the above described converter 10 of FIG. 1, nodes 135 and 235 are analogous to node 35, capacitors 130 and 230 to integrator 30, comparator 180 and 280 to ADC 80, and feedback units 160 and 260 to DAC 60. The term 'capacitor' as used herein is intended to include any elements having capacitances. As a person skilled in the art will understand, it is possible to construct a similar converter without voltage-to-current converter 120 and without differential transistor pairs 140 and 240. Converter 100 has first power terminal 101, second power terminal 102, optional positive input terminal 105, optional negative input terminal 205, output terminal 106, and clock terminal 108. First reference terminal 104 (REF 1) and second reference terminal 103 (REF 2) are also optional and show that the desired reference voltages $V_{R1}$ and $V_{R2}$ can be provided from outside or produced internally. Output terminal 106 is provided to supply the single-bit oversampled digital signal $S_D$.

In FIG. 2, connections between any element and power terminal 101 are indicated by an arrow pointing up, and connections between elements and power terminal 102 are indicated by an arrow pointing down. Positive and negative input terminals 105 and 205 can be provided for supplying differential analog signal $S_A$ to converter 100. Analog signal $S_A$ can be a differential voltage $V_D$ (191) which is the voltage difference between positive input terminal 105 and negative input terminal 205. VIC 120 can be coupled to positive input terminals 105 at input 121 and to negative input terminal 205 at input 221. Any circuit can be used what transfers a differential voltage $V_D$ into a differential current $I_D$. For example, VIC 120 can be a circuit as described in above mentioned patent application [1] which is incorporated herein by reference.

Differential current $I_D$ has first component current $I_1$ (output 122) and second component current $I_2$ (output 222). VIC 120 is coupled via outputs 122 and 222 and coupling transistors 127 and 227 to nodes 135 and 235. In case VIC 120 is not used, the differential analog signal $S_A$ is supplied directly by first component current $I_1$ (192) and second component current $I_2$ (292) to current terminals 107 and 207, respectively. Current terminals 107 and 207 are coupled to nodes 135 and 235, respectively, via coupling transistors 127 and 227.

The term 'transistor' is used hereinafter to refer to any device having main electrodes (e.g., sources (S) and drains (D)) and a control electrode (e.g., gates (G)). The transistors of the described preferred embodiment are field-effect transistors (FET). As a person of skill in the art will understand, other transistors can also be used.

First capacitors 130 has first plate 133 coupled to first node 135. Second capacitor has second plate 233 coupled to second node 235. First capacitor 130 and second capacitor 230 have a common plate 131 coupled to either first power terminal 101 or to second power terminal 102. Common plate 131 is in the following referred to as common node 131. Capacitor voltages $V_1$ (195) and $V_2$ (295) are defined between nodes 135 and 235, respectively, and common node 131. The term 'capacitor voltage' used herein includes all physical units characterizing the energy stored in a capacitor and has in the same meaning as 'capacitor charge'. Capacitors 130 and 230 are coupled to inputs 141 and 241 of differential transistor pairs 140 and 240 and to outputs 161 and 261 of feedback units 160 and 260, respectively.

Differential transistor pair 140 comprises common source transistors 142 and 143. Differential transistor pair 140 has a second input 149 coupled to reference terminal 104 (REF 1) to receive reference voltage $V_{R1}$. Differential transistor pair 140 supplies auxiliary currents $I_{p1}$ (196) and $I_{n1}$ (197) at outputs 146 and 147. It is coupled to comparator 180 at inputs 186 and 187. The gate (G) of transistor 142 is input 141 for receiving capacitor voltage $V_1$. The gate of transistor 143 is input 149 for receiving reference voltage $V_{R1}$. The common sources (S) are coupled via node 145 to power terminal 101. The drains (D) are coupled to outputs 146 and 147 for providing auxiliary currents $I_{p1}$ (196), $I_{n1}$ (197).

Construction and function of differential transistor pair 240 is the same as for differential transistor pair 140. Input 241 is provided to receive capacitor voltage $V_2$. It has outputs 246 and 247 for supplying auxiliary currents $I_{p2}$ and $I_{n2}$.

Comparator 180 has inputs 186 (EP) and 187 (IM) for receiving auxiliary currents $I_{p1}$ and $I_{n1}$. It has positive and negative outputs 184 (OP) and 185 (OM) for providing auxiliary signals $p_1$ and $n_1$. Auxiliary signals $p_1$ and $n_1$ are collectively referred to as first auxiliary signal 193. Output 181 (OD) is provided for supplying digital signal $S_D$ (194) and is coupled to output terminal 106. Comparator 180 is controlled by clock signal CLK which can be supplied from clock terminal 108 to input 188.

Construction and function of comparator 280 is similar to comparator 180. In difference, comparator 280 has only outputs 284 (OP) and 285 (OM) for supplying auxiliary signals $p_2$ and $n_2$. Auxiliary signals $p_2$ and $n_2$ are collectively referred to as second auxiliary signal 293. Comparator 280 has inputs 286 and 287 for receiving $I_{p2}$ and $I_{n2}$ from differential transistor pair 240 and input 288 for receiving clock signal CLK. Comparators 180 and 280 will be explained below in reference to FIGS. 3–4.

At inputs 164, 165, feedback unit 160 is coupled to comparator 180 for receiving auxiliary signals $p_1$ and $n_1$. Feedback unit 160 has also input 168 coupled to clock terminal 108 for receiving clock signal CLK. Input 162 is coupled to reference terminal 104 (REF 1), input 163 to reference terminal 103 (REF 2) for receiving reference voltages $V_{R1}$ and $V_{R2}$.

Feedback unit 160 is a switching network. It comprises switch transistors 174, 175, 178 and cascoded transistors 171, 172, 173, 176, 177, 179 (cascode transistors). Switch transistor 178 and cascode transistors 179 and 171 are serially coupled by source (S), and drain (D) via node 169 to power terminal 101 and to power terminal 102. Switch transistor 175 and cascode transistors 177 and 172 are serially coupled via node 169 to power terminal 101 and to power terminal 102. Switch transistor 174 and cascode transistors 176 and 173 are serially coupled via output 161 between node 169 and node 135.

The gates (G) of switch transistors 174 and 175 are coupled to outputs 184 and 185 of comparator 180 via inputs 164 and 165, for receiving auxiliary signals $p_1$ and $n_1$. The gate (G) of switch transistors 178 is coupled via input 168 to clock terminal 108 for receiving clock signal CLK. The gates (G) of cascode transistors 176, 177, 179 are coupled to reference terminal 104 (REF 1) for receiving reference voltage $V_{R1}$. The gates of cascode transistors 173, 172, 171 are coupled to reference terminal 103 (REF 2) for receiving reference voltage $V_{R2}$.

Construction and function of feedback unit 260 is the same as for feedback unit 160. It has output 261 coupled to node 235 and inputs 264, 265 coupled to comparator 280 for receiving auxiliary signals $p_2$ and $n_2$. Inputs 262, 263, and 268 are for receiving reference voltages $V_{R1}$ and $V_{R2}$, and clock signal CLK.

Comparator 180, 280 further comprises internal logic circuits such as flip-flops (FF). Construction and function of comparator 180 will be explained in connection with FIGS. 3–4. As it can be seen in FIG. 4, the auxiliary signals $p_1$, $p_2$, $n_1$, $n_2$ return to zero at $f_{CLK}$.

The function of converter 100 is as follows: Analog signal $S_A$ is supplied as differential voltage $V_D$ to VIC 120 and converted into differential current $I_D$ with first component currents $I_1$ and second component current $I_2$. Via nodes 135 and 235 capacitors 130 and 230 are charged differentially. That means, for example, capacitor 130 is charged and capacitor 230 is discharged. First component current $I_1$ (192) and second component current $I_2$ (292) are integrated to first capacitor voltage $V_1$ (195) and second capacitor voltage $V_2$ (295), respectively. In differential transistor pairs 140 and 240, these capacitor voltages $V_1$ and $V_2$ are compared to reference voltage $V_{R1}$. Auxiliary currents $I_{p1}$ and $I_{n1}$ of differential transistor pair 140 and $I_{p2}$ and $I_{n2}$ of differential transistor pair 240 control comparators 180 and 280, respectively. In comparators 180 and 280 auxiliary signals $p_1$, $n_1$ and $p_2$, $n_2$ are generated. Feedback units 160 and 260 are controlled by $p_1$, $n_1$, $p_2$, $n_2$ and the capacitors are selectively discharged. The auxiliary signals are further used in comparator 180 to obtain digital signal $S_D$.

Figure 5A:
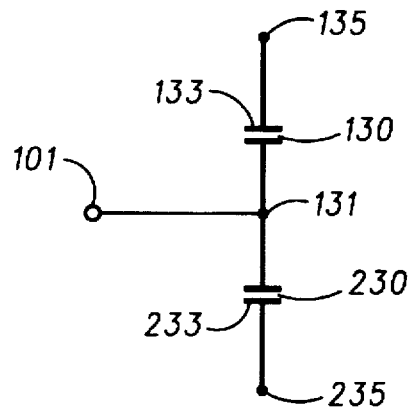
FIGS. 5A–B are simplified circuit diagrams showing implementations of the integrating capacitor in FIG. 2.
Figure 5B:
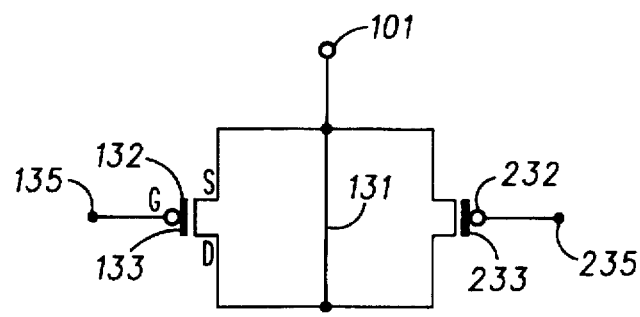
Figure 6A:
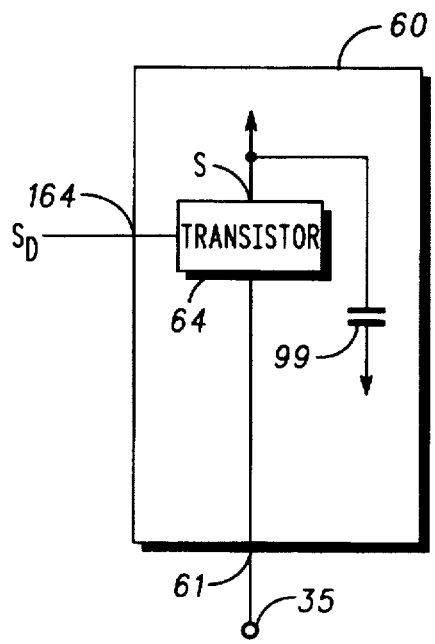
FIGS. 6A–B are simplified schematic diagrams illustrating one aspect of the invention by comparing analogous portions of the circuits of FIGS. 1 and 2.
Figure 6B:
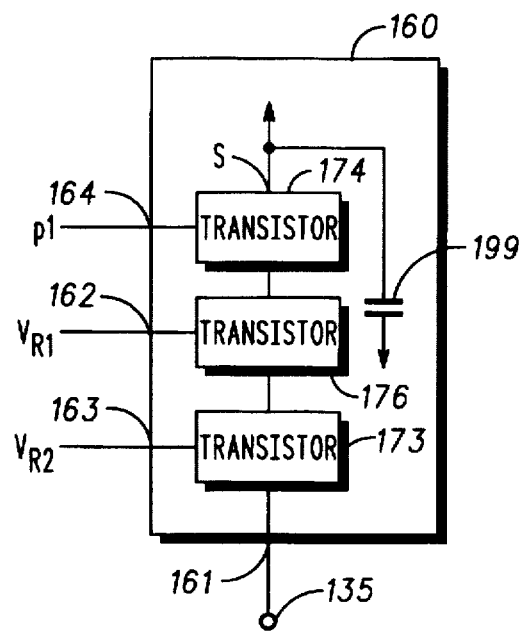

The present invention conveniently uses a combination of several techniques. The construction and operation of converter 100 will be better understood by reference to the following details:

a) FIGS. 5A–B are simplified circuit diagrams showing implementations of capacitors 130 and 230 by single poly MOS transistors. FIG. 5A is a detail of FIG. 2. FIG. 5B shows p-type MOS transistors 132 and 232. First MOS transistor 132 and second MOS transistor 232 operate as capacitors 130 and 230 with the capacity between gate (G) and drain (D), source (S) used. Source and drain of transistor 132 and of transistor 232 are tied together to form common plate 131. First gate of transistor 132 forms first plate 133. Second gate of transistor 232 forms second plate 233. Common plate 131 is coupled to power terminal 101. First plate 133 and second plate 233 are coupled to nodes 135 and 235, respectively. FIGS. 5A–B are also applicable to illustrate the integration of first capacitor 530 and second capacitor 630 of converter 500 which will be explained in connection with FIGS. 9A–B.

b) FIGS. 6A–B are simplified schematic diagrams showing how the transistors in feedback unit 160 are cascoded and how parasitic capacitors in the feedback loop can be decoupled. FIG. 6A shows a part of prior art DAC 60 and node 35 of FIG. 1. A digital signal $S_D$ controls switch transistor 64. Parasitic capacitor 99 is drawn between source (S) and ground. The charge on parasitic capacitor 99 is signal sensitive. As in the invention, FIG. 6B shows part of feedback unit 160 of FIG. 2. Parasitic capacitor 199 is drawn between source (S) of switch transistor 174 and ground. The influence of parasitic capacitor 199 to node 135 is reduced because of cascode transistors 176 and 173. The discharging of capacitors 130, 230 by parasitic capacitor 199 has less effects than in prior art.

c) Converter 100 is preferably implemented differentially. Every unit and every signal is available twice. The analog signal $S_A$ is differential as voltage $V_D$ at VIC 120 or as current $I_D$ ($I_1$, $I_2$) at current terminals 107, 207. Capacitors 130 and 230 are charged differentially. Differential transistor pair 140 compares the single ended capacitor voltage $V_1$ with the single ended reference voltage $V_{R1}$ and generates differentially auxiliary currents $I_{p1}$ and $I_{n1}$. Comparator 180 supplies differential auxiliary signals $p_1$ and $n_1$. The same is applicable for differential transistor pair 240 ($I_{p2}$, $I_{n2}$) and comparator 280 ($p_2$, $n_2$). Feedback is executed for capacitors 130 and 230 by two feedback units 160 and 260.

d) The auxiliary signals $p_1$, $p_2$, $n_1$, $n_2$ return to zero at $f_{CLK}$. The mentioned quantization noise leakage is thereby reduced.

The method for converting a differential analog signal $S_A$ having a first component (e.g., $I_1$) and a second component (e.g., $I_2$) into a digital signal $S_D$ can conveniently be described by the following steps:

integrating first component $I_1$ and second component $I_2$ by first MOS transistor 132 and second MOS transistor 232, respectively, MOS transistor 132 and MOS transistor 232 having their sources and drains coupled together to first power terminal 101 or to second power terminal 102, MOS transistor 132 receiving first component $I_1$ at a gate and providing first capacitor charge $V_1$, MOS transistor 232 receiving second component $I_2$ at a gate and providing second capacitor charge $V_2$;

receiving capacitor charge $V_1$ and capacitor charge $V_2$ by first comparator 180 and second comparator 280, respectively, comparator 180 providing first auxiliary signal 193 and digital signal $S_D$, second comparator 280 providing second auxiliary signal 293; and charging and discharging MOS transistor 132 and MOS transistor 232 by first feedback unit 160 and by second feedback unit 260, respectively, feedback unit 160 being controlled by auxiliary signal 193 and feedback unit 260 being controlled by auxiliary signal 293, respectively.

FIG. 7 is a simplified schematic block diagram of digital signal processing (DSP) circuit 300. DSP circuit 300 comprises converter 100, filter 320, processor 350, dither converter 360, and shift register 370. DSP circuit 300 has positive input terminal 105 and negative input terminal 205 at converter 100 for receiving analog signal $S_A$ and output terminal 306 at processor 350 for providing data signal $S_{DATA}$.

Converter 100 can be as described in FIG. 2. Converter 100 is coupled to filter 320 via output terminal 106. Filter 320 is coupled to processor 350. Shift register 370 is coupled to dither converter 360 which is coupled to converter 100 at current terminals 107, 207.

In converter 100, analog signal $S_A$ is transformed into digital signal $S_D$. This one bit oversampled digital signal $S_D$ is supplied to filter 320. Usually, filter 320 is a low pass filter (LPF) and serves to protect against aliasing and to filter out quantization noise. Filter 320 modifies digital signal $S_D$ to digital signal $S_D*$. Digital signal $S_D*$ is further manipulated in processor 350. Data signal $S_{DATA}$ can be read at output terminal 306.

Shift register 370 has a XOR feedback function and delivers a 1-bit random signal $S_R$ (372) to dither converter 360. A dither current $I_{dither}$ (362) from dither converter 360 is supplied to converter 100 at current terminal 107, 207.

DSP circuit 300 illustrates an example of an integrated circuit with analog and digital structures. Converter 100 and dither converter 360 belong to the analog domain. The other units form the digital domain.

Figure 3:
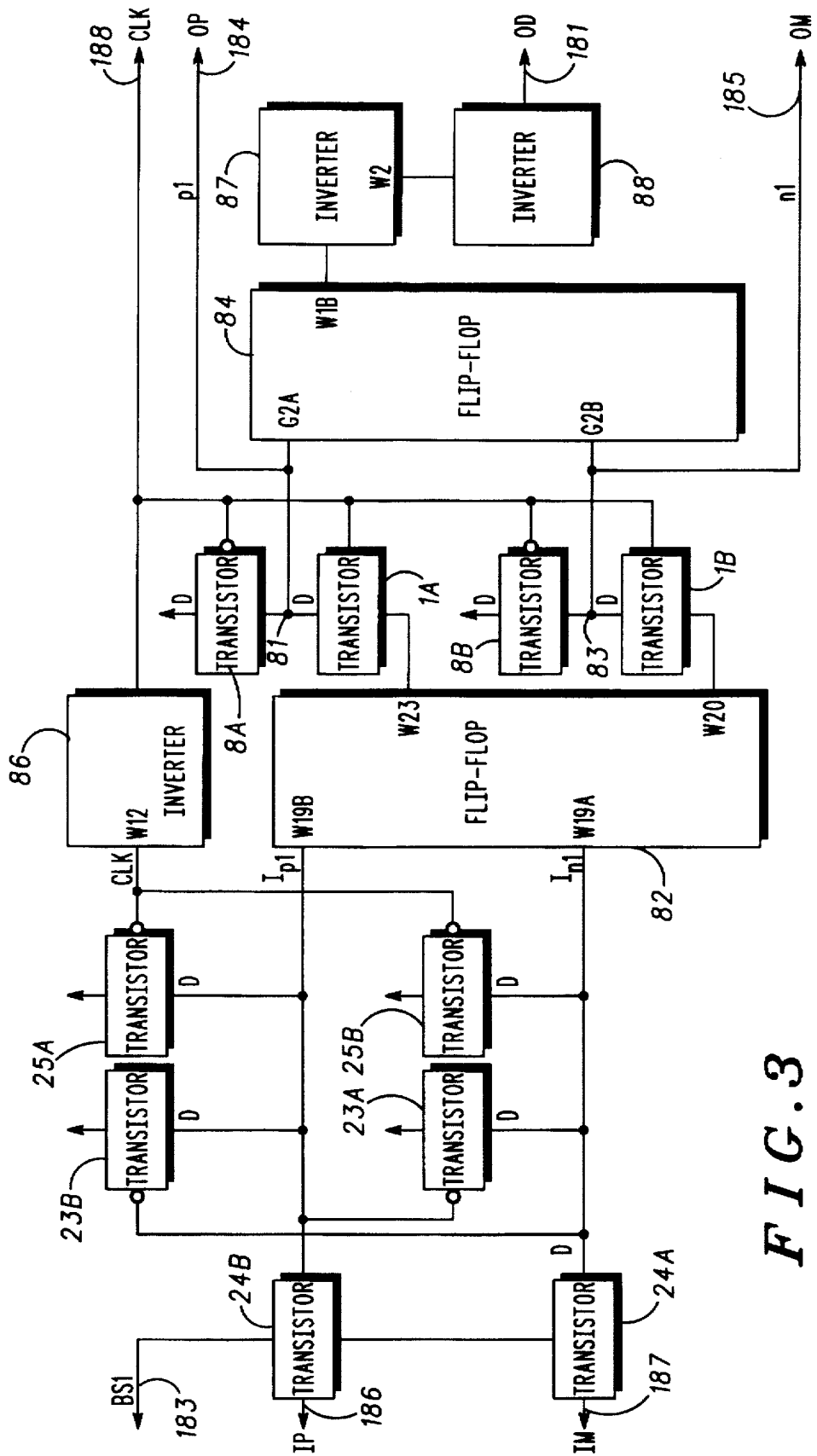
FIG. 3 is a simplified circuit diagram of a comparator as it can be used in a converter of FIG. 2.

FIG. 3 is a simplified schematic circuit diagram of comparator 180. Comparator 180 and comparator 280 can be used in converter 100 of FIG. 2. Comparator 280 is similar to comparator 180. The construction and the function is explained for comparator 180. In FIG. 3, reference numbers 181, 185, 184, 186, 187, and 188 correspond to the inputs and outputs of comparator 180 as shown in FIG. 2. Connections to power terminal 101 (FIG. 2) are indicated by an arrow pointing up. Comparator 180 comprises flip-flops 82, 84, inverter 86, 87, 88 and field effect transistors (FETs) 24A/B, 23A/B, 25A/B, 1A/B, and 8A/B.

Inverter 86 is coupled to clock input 188 for receiving clock signal CLK and inverting it into CLK at output W12. The underlining of 'CLK' symbolizes inversion.

Input 186 (IP) is coupled to input W19B of flip-flop 82 via the S-D-path (source-drain) of FET 24B. Input 187 (IM) is coupled to input W19A of flip-flop 82 via the S-D-path of FET 24A. The gates of FET 24A/B are coupled to input 183 for receiving a bias voltage BS1.

Input W19A and input W19B of flip-flop 82 are cross coupled: Input W19A of flip-flop 82 is coupled to power terminal 101 via the D-S-path of FET 23A. The gate of FET 23A is coupled to input W19B. Input W19B of flip-flop 82 is coupled to power terminal 101 via the D-S-path of FET 23B. The gate of FET 23B is coupled to input W19A.

Input W19A and W19B of flip-flop 82 are also coupled to clock input 188 (CLK): Inputs W19A and W19B are coupled to power terminal 101 via the D-S-paths of FET 25B and FET 25A, respectively. The gates of FET 25A/B are coupled to output W12 of inverter 86 for receiving CLK.

Output W23 of flip-flop 82 is coupled to power terminal 101 via the S-D-path of FET 1A, node 81, and the S-D-path of FET 8A. Output W20 is coupled to power terminal 101 via FET 1B, node 83, and FET 8B. The sources of FET 8A/B, 1A/B are coupled to clock input 188.

Auxiliary signal $p_1$ is available at node 81. Auxiliary signal $n_1$ is available at node 83. Node 81 is coupled to input G2A of flip-flop 84 and to output 184 (OP). Node 83 is coupled to input G2B and to output 185 (OM).

Flip-flop 84 has output W1B coupled to cascaded inverters 87 and 88. Inverter 88 supplies digital signal $S_D$ to output 181 (OD) of comparator 180.

In the best mode embodiment, converter 100 and therefore also comparator 180 are conveniently implemented using single-poly CMOS technology. In comparator 180, FET 24A/B, FET 1A/B are n-type FETs. FET 23A/B, 25A/B, and 8A/B are p-type FETs. In FIG. 3, p-type FETs are indicated by a circle at the gate. Each inverter 86, 87, 88 comprises an n-type and a p-type FET. Flip-flops 82, 84 comprise both n-type and p-type FETs. Power terminal 101 symbolizes high voltage, as for example $V_{DD}$. It is possible to configure comparator 180 in a different way and with different elements. Especially, the conductivity types of the FETs can be reversed. In comparison to comparator 180, comparator 280 does not have output 181. The units for generating digital signal $S_D$, such as flip-flop 84, inverter 87, 88, can be left out.

The function of comparator 180 will be explained in the following. For convenience of explanation, the term 'HIGH' means a voltage near the voltage of power terminal 101, such as $V_{DD}$, and 'LOW' means a voltage at the opposite logical level. Auxiliary currents $I_{p1}$ and $I_{n1}$ are supplied to flip-flop 82. Outputs W23 and W20 of flip-flop 82 are always inverted. When W23 is HIGH, then W20 is LOW, and vice versa. First, suppose, $I_{p1}$ is lower then $I_{n1}$. FET 23A is conductive and pulls input W19A of flip-flop 82 to HIGH. W20 is LOW, W23 is HIGH. With the clock signal CLK= HIGH, FETs 1A and 1B become conductive, and the state of W20 and W23 is transferred as $p_1$=HIGH and $n_1$=LOW to outputs 184, 185 (OP, OM) and to inputs G2A, G2B of flip-flop 84. Output W1B of flip-flop 84 is LOW. After double inversion in inverter 87 and 88, $S_D$ (OD) is LOW. Second, suppose that $I_{p1}$ is increased and becomes higher then $I_{n1}$. FET 23B becomes conductive and pulls input W19B of flip-flop 82 to HIGH. Flip-flop 82 flips and W23 becomes LOW and W20 HIGH. With the clock signal CLK=HIGH the state is transferred as $p_1$=LOW and $n_1$=HIGH. After flipping of flip-flop 84 and the double inversion by inverter 87, 88, $S_D$ becomes HIGH. Third, when the clock signal CLK becomes LOW than FETs 1A and 1B are not conductive. By FET 8A and 8B nodes 81 and 83 are pushed to LOW. Auxiliary signals $p_1$ and $n_1$ become LOW. Flip-flop 84 remains unchanged because both inputs G2A and G2B are LOW. Digital signal $S_D$ at output 181 (OD) is also not changed. Flip-flop 84 and inverters 87 and 88 are produce digital signal $S_D$ in which HIGH-state and LOW-state are distinctive enough to be read in further circuits. When CLK=HIGH then CLK=LOW and FETs 25A/B are conductive and pull both inputs 19B and 19A of flip-flop 82 higher to power terminal 101.

Figure 4:
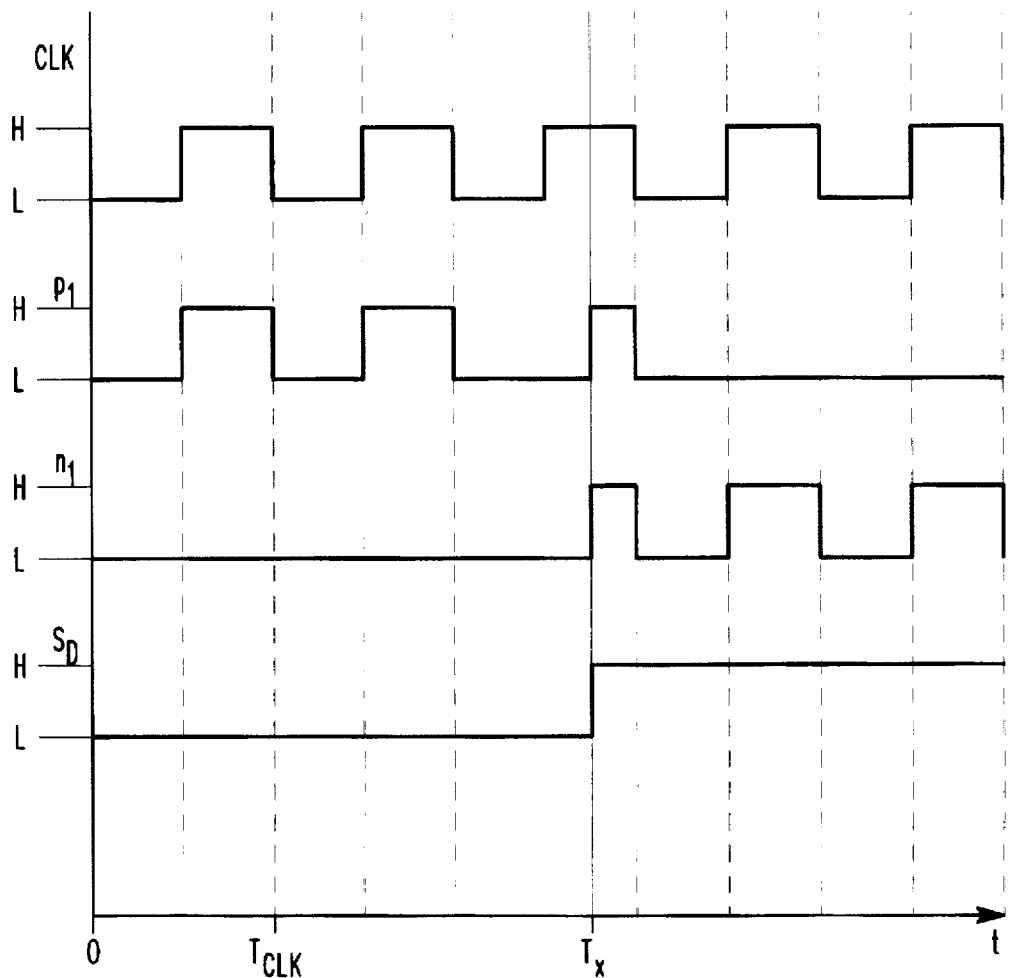
FIG. 4 is a signal timing diagram for the comparator of FIG. 3.

FIG. 4 is a simplified signal timing diagram to illustrate the signals at comparator 180. The vertical axis shows clock signal CLK, auxiliary signals $p_1$, $n_1$, and digital signal $S_D$. 'H' stands for 'HIGH' and 'L' for 'LOW'. The horizontal axis shows the time t with time intervals $T_{CLK}=1/f_{CLK}$. As an example, the pulse duty for CLK is chosen with $T_{HIGH}= T_{LOW}=T_{CLK}/2$. During the time from t=0 to t=$T_x$, auxiliary current $I_{p1}$ is lower than $I_{n1}$. Output W23 of flip-flop 82 is HIGH and $p_1$ oscillates between HIGH and LOW. Output W1B of flip-flop 84 remains HIGH and the digital signal $S_D$ is LOW. At t=$T_x$ auxiliary current $I_{p1}$ becomes higher than $I_{n1}$. That time $T_x$ depends on $I_{p1}$ and $I_{n1}$ and does not depend on CLK. Output W23 goes to LOW, output W20 to HIGH and $n_1$ starts oscillating between HIGH and LOW. Flip-flop 84 also flips and the digital signal $S_D$ becomes HIGH. As a merit of the invention, auxiliary signals $p_1$ and $n_1$ return to zero with CLK returning to zero.

A second embodiment of the invention is described in reference to FIGS. 8–15. FIG. 8 is a simplified schematic block diagram of digital-to-analog converter 11, hereinafter converter 11. The analog signal $S_A$ is converted into the digital signal components $S_{D1}$ and $S_{DT}$. Converter 11 comprises input stage 20, analog-to-digital converter (ADC) 50, digital-to-analog converter (DAC) 70, and, conveniently, converter 100 of FIG. 2 or equivalent. Input stage 20 receives analog signal $S_A$ and supplies analog signals $S_{A1}$ and $S_{A2}$. $S_{A1}$ and $S_{A2}$ can be identical. It is only required that $S_{A1}$ and $S_{A2}$ are decoupled and can not influence each other. $S_{A1}$ is supplied to converter 100 where it is converted into the digital signal component $S_{D1}$. $S_{A2}$ is converted in ADC 50 into the digital signal component $S_{DT}$. The component $S_{DT}$ is then converted into the analog feedback signal $S_F$, which is mixed with $S_{A1}$. ADC 50 and DAC 70 can be considered as an input feedback loop. The digital signal components $S_{D1}$ and $S_{DT}$ represent the analog signal $S_A$ in different ways. $S_{DT}$ of ADC 50 represents an approximation of $S_A$, which is used to determine $S_{D1}$ in converter 100. For example, $S_{A1}$ can be changed by $S_F$ in a way that the amplitude is reduced. In this case, the requirements for components and construction of converter 100 can be reduced.

Figure 9A:
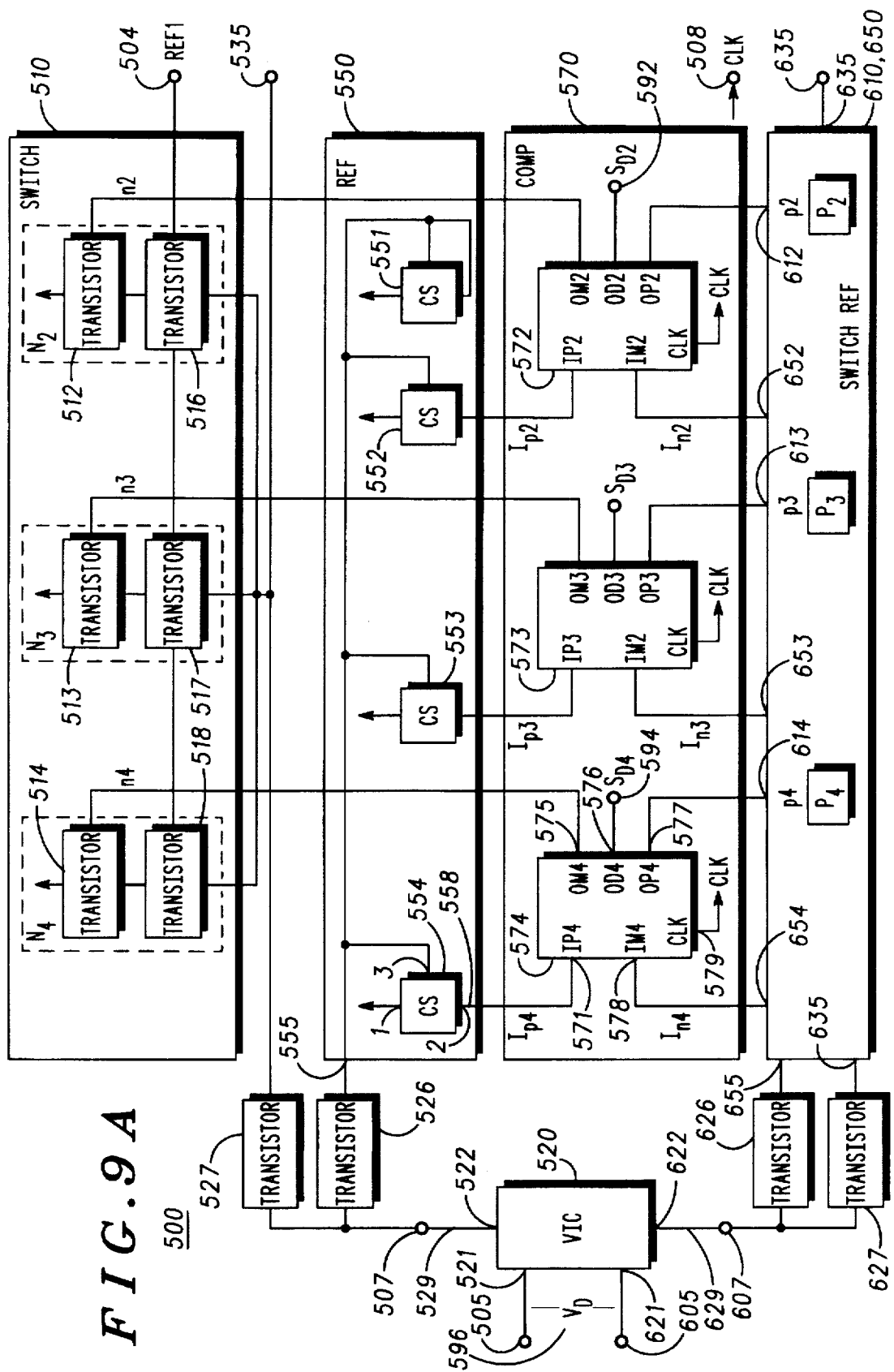

FIGS. 9A–B are simplified schematic block diagrams of delta-sigma analog-to-digital converter 500. FIG. 9B is a continuation of FIG. 9A. Both figures are connected in first node 535 and second node 635. Converter 500 is the application of the design principle of converter 11 in the second embodiment of the invention.

As shown in FIG. 9A, converter 500 comprises optional voltage-to-current converter (VIC) 520, comparator bank 570, reference banks 550 and 650, and switch banks 510 and 610. As in FIG. 9B, converter 500 further comprises capacitor 530, 630, feedback unit 560, differential transistor pair 540, and comparator 580. Converter 500 has first power terminal 501, second power terminal 502, clock terminal 508, optional positive input terminal 505, and optional negative input terminal 505. The conductors coupling first power terminal 501 and second power terminal 502 to various circuit elements are omitted for simplicity. Output terminals 591 to 594 are provided for supplying first, second, third, and fourth digital signal components $S_{D1}$ to $S_{D4}$, respectively. Reference terminal 504 is optional and symbolizes that a reference voltage $V_{R1}$ should be provided from outside or produced internally.

In FIGS. 9A–B, connections between any element and power terminal 501 are indicated by an arrow pointing up. Positive input terminal 505 and negative input terminal 605 can be provided for differentially supplying analog signal $S_A$ to converter 500. Analog signal $S_A$ can be a differential voltage $V_D$ (596) which is the voltage difference between positive input terminal 505 and negative input terminal 605. Corresponding to converter 11 of FIG. 8, VIC 520 and coupling transistors 526, 527, 626, 627 form input stage 20; reference banks 550 and 650 and comparator bank 570 form ADC 50, and switch banks 510 and 610 form DAC 70. For the components of converter 500 of FIGS. 9A–B and converter 10 of FIG. 8 and FIG. 1, the following correspondences are applicable: nodes 535 and 635 to node 35; capacitors 530 and 630 to integrator 30; comparator 580 and differential transistor pair 540 to ADC 80; and feedback unit 560 to DAC 60. Digital signal component $S_{D1}$ is identical for converters 11 and 500. Second, third, and fourth digital signal components $S_{D2}$, $S_{D3}$, $S_{D4}$ of converter 500 correspond to $S_{DT}$ of converter 11.

First, the elements shown in FIG. 9A are explained. VIC 520 is coupled to positive input terminal 505 and negative input terminals 605 at inputs 521 and 621, respectively. As VIC 520 any circuit can be used which transfers a differential voltage $V_D$ into a differential current $I_D$. For example, VIC 520 can be a converter as introduced in above mentioned patent application [1].

Differential current $I_D$ with first component current $I_1$ (529) and second component current $I_2$ (629) is available at outputs 522 and 622, respectively, of VIC 520. Outputs 522 and 622 are coupled to capacitors 530 and 630 at node 535 and 635 and to switch banks 510 and 610 via coupling transistors 527, 627, respectively. Outputs 522, 622 are also coupled to reference bank 550, 650 via coupling transistors 526, 626 and inputs 555, 655. In case VIC 520 is not used, analog signal $S_A$ is supplied as differential current $I_D$ with first component current $I_1$ (529) and second component current $I_2$ (529, 629) to current terminals 507, 607.

Switch bank 510 comprises switch transistors 512, 513, 514 which are serially coupled to cascode transistors 516, 517, 518. Cascode transistors 516, 517, 518 are biased by reference voltage $V_{R1}$ from reference terminal 504. For further explanations, the serial arrangement of switch transistor 512 and cascode transistor 516 is referred to as transistor pair $N_2$. Accordingly, switch transistor 513 and cascode transistor 517 form transistor pair $N_3$; switch transistor 514 and cascode transistor 517 form transistor pair $N_4$. In FIG. 9A, transistor pairs $N_2$, $N_3$, $N_4$ are indicated by dashed boxes. Transistor pairs $N_2$, $N_3$, and $N_4$ are coupled between first power terminal 501 and node 535.

Reference bank 550 comprises variable current sources 551, 552, 553, 554 for producing auxiliary currents $I_{p2}$, $I_{p3}$, $I_{p4}$ (first current vector $I_{p2}/I_{p3}/I_{p4}$, collectively $I_p$). Current $I_{p4}$ is indicated by number 558 at current source 554. Current sources 551, 552, 553, 554 are coupled to input 555 of reference bank 550 for controlling the values of $I_{p2}$, $I_{p3}$, $I_{p4}$. Current sources 551, 552, 553, and 554 can be implemented by transistors.

As far as construction and function of switch bank 610 and reference bank 650 are identically to switch bank 510 and reference bank 550, switch bank 610 and reference bank 650 are indicated by one block having reference numbers 610 and 650. Switch bank 610 comprises transistor pairs $P_2$, $P_3$, and $P_4$. Reference bank 650 is controlled through input 655 of reference bank 650. Reference bank 650 generates auxiliary currents $I_{n2}$, $I_{n3}$, $I_{n4}$ (second current vector $I_{n2}/I_{n3}/I_{n4}$, collectively $I_n$). The auxiliary currents $I_p$ and $I_n$ are also referred to as current pairs. $I_{p2}$ and $I_{n2}$ form current pair $I_{pn2}$, $I_{p3}$ and $I_{n3}$ from current pair $I_{pn3}$ and so on. Variable current sources 551, 552, 553, and 554 of reference bank 550 and variable current sources 651, 652, 653, and 654 of reference bank 650 can show current mismatches. Reasons for that unwanted mismatches have been explained in patent application [2] which is incorporated herein by reference. These inaccuracies can be distributed to other parts of converter 500, such as to comparator 580. Ways to reduce mismatch effects will be explained in connection with FIGS. 14–15.

Comparator bank 570 comprise a plurality of comparators 572, 573, 574. Preferably, the plurality has the magnitude of three. Also, signal vectors related to the plurality of comparators have three elements. This assumption is convenient but not essential. A person of skill in the art will increase or descrease this number without departing from the scope of the invention. In the example, the construction and the function will be explained in connection with FIG. 11. As an example, inputs, outputs and signals are given for comparator 574. Comparator 576 has inputs 571, 578 (IP4, IM4) for receiving auxiliary currents $I_{p4}$ and $I_{n4}$ from reference banks 550 and 650. Comparator 576 has input 579 for receiving a clock signal CLK. Comparator 576 has outputs 575 (OM4) for providing digital auxiliary signal $n_4$ to the gate (G) of switch transistor 514 of switch bank 510. Comparator 576 has output 577 for providing digital auxiliary signal $p_4$ to switch transistor 614 (of pair $P_4$) of switch bank 610. Comparators 572, 573, 574 are controlled by clock signal which can be supplied from clock terminal 508. Fourth digital signal component $S_{D4}$ is available at output 576 (OD4) which is coupled to output terminal 594. Comparators 572 and 573 have outputs coupled to output terminals 592 and 593 for supplying second digital signal components $S_{D2}$ and third digital signal component $S_{D3}$. Comparators 572 and 573 provide digital auxiliary signals $n_2,p_2$ and $n_3,p_3$, respectively. Digital auxiliary signals $n_2$, $n_3$, and $n_4$ are referred to as first digital vector $n_2/n_3/n_4$. Digital auxiliary signals $p_2,p_3$, and $p_4$ are referred to as second digital vector $p_2/p_3/p_4$. Digital auxiliary signals $p_2$ and $n_2$ form signal pair $pn_2$, signals $p_3$ and $n_3$ form signal pair $pn_3$ and so on. Therefore, every comparator of comparator bank 570 receives a current pair current pair $I_{pn}$ and generates a signal pair pn.

Now, the elements in FIG. 9B are explained. First capacitor 530 has first plate 533 coupled to first node 535, second capacitor 630 has second plate 633 coupled to second node 635. Capacitors 530 and 630 have common plate 531 coupled to first power terminal 501. It is also possible to coupled common plate 531 to second terminal 502. The voltages between nodes 535 and 635 and second power terminal 502 are further referred to as first capacitor voltage $V_1$ (595) and second capacitor voltage $V_2$ (695). First capacitor 530 and second capacitor 630 are implemented by first MOS transistor 132 and second MOS transistor 232 coupled together as shown in FIG. 5B.

Differential transistor pair 540 is provided for receiving capacitor voltages $V_1$ and $V_2$ and providing equivalent auxiliary currents $I_a$ (546) and $I_b$ (547). Differential transistor pair 540 has transistors 542 and 543 coupled via node 545 to power terminal 501. Transistor 542 and 543 have control electrodes coupled to node 535, 635 for receiving capacitor voltages $V_1$ (595) and $V_2$ (695), respectively. Transistors 542, 543 are also coupled to comparator 580 via inputs 586 (IP1) and 587 (IM1) for supplying auxiliary currents $I_a$ and $I_b$.

Construction and function of comparator 580 will be explained in detail in connection with FIG. 10. Comparator 580 has output 581 (OD1) for providing first digital signal component $S_{D1}$ (506) to output terminal 591. Comparator 580 is controlled by a clock signal CLK which can be supplied from clock terminal 508 to input 588. At output 584, 585 (OP1, OM1) first digital auxiliary signal $n_1$ and second digital auxiliary signal $p_1$ are available. Signals $p_1$ and $n_1$ return to zero at $f_{CLK}$.

Feedback unit 560 comprises transistor pairs $N_1$ and $P_1$ (dashed lines) having switch transistors 564 and 565 and cascode transistors 566 and 567. Transistor pair $N_1$ is formed by switch transistor 565 and cascode transistor 567 which are serially coupled between power terminal 501 and node 535 via output 561. Transistor pair $P_1$ is formed by switch transistor 564 and cascode transistor 566 which are serially coupled between power terminal 501 and node 635 via output 562. Cascode transistors 566, 567 are biased by reference voltage $V_{R1}$ from reference terminal 504.

First reference bank 510 and second reference bank 610 differentially receive analog signal $S_A$ (components 507, 607) and send current pairs to the comparators of comparator bank 570. Comparators 580, 572, 573, and 574 send digital auxiliary signals $n_1$, $n_2$, $n_3$, and $n_4$ to transistor pairs $N_1$, $N_2$, $N_3$, and $N_4$, respectively. Comparators 580, 572, 573, and 574 send digital auxiliary signals $p_1$, $p_2$, $p_3$, and $p_4$ to transistor pairs $P_1$, $P_2$, $P_3$, and $P_4$, respectively. The signal pairs pn of comparator bank 570 respond to the current pairs from reference banks 510 and 610. The signal pairs cause first switch bank 510 and second switch bank 610 charge or discharge first capacitor 530 or second capacitors 630.

The method of converting a differential analog signal $S_A$ which has a first component (e.g., $I_1$) and a second component (e.g., $I_2$) to a digital signal $S_D$ with at least a first, a second and a third digital component ($S_{D1}$, $S_{D2}$, $S_{D3}$) can also be decribed in other words by the following method steps:

A first capacitance (e.g., 530) integrates the first component (e.g., $I_1$) and a second capacitance (e.g., 630) integrates the second component (e.g., $I_2$). Thereby, a first capacitor charge (e.g., $V_1$) and a second capacitor charge (e.g., $V_2$), respectively, are provided.

A first comparator (e.g., 580) compares the first capacitor charge (e.g., $V_1$) and the second capacitor charge (e.g., $V_2$) and provides thereby the first digital signal component ($S_{D1}$).

A first reference bank (e.g., 550) provides a first current vector (e.g., $I_p$) in response to the first component (e.g., $I_1$) and a second bank (e.g., 650) provides a second current vector (e.g., $I_n$) in response to the second component (e.g., $I_2$).

A comparator bank (e.g., 570) receives the first current vector (e.g., $I_p$) and the second current vector (e.g., $I_n$) and provides a first digital vector (e.g., $n_2/n_3$), a second digital vector (e.g., $p_2/p_3$), and at least the second digital signal component ($S_{D2}$) and the third digital signal component ($S_{D3}$).

A first and second switch banks (e.g., 510, 610) charge or discharge the first and second capacitances (e.g., 530, 630) in response to the first and second digital vectors (e.g., $n_2/n_3$, $p_2/p_3$), respectively.

Figure 10:
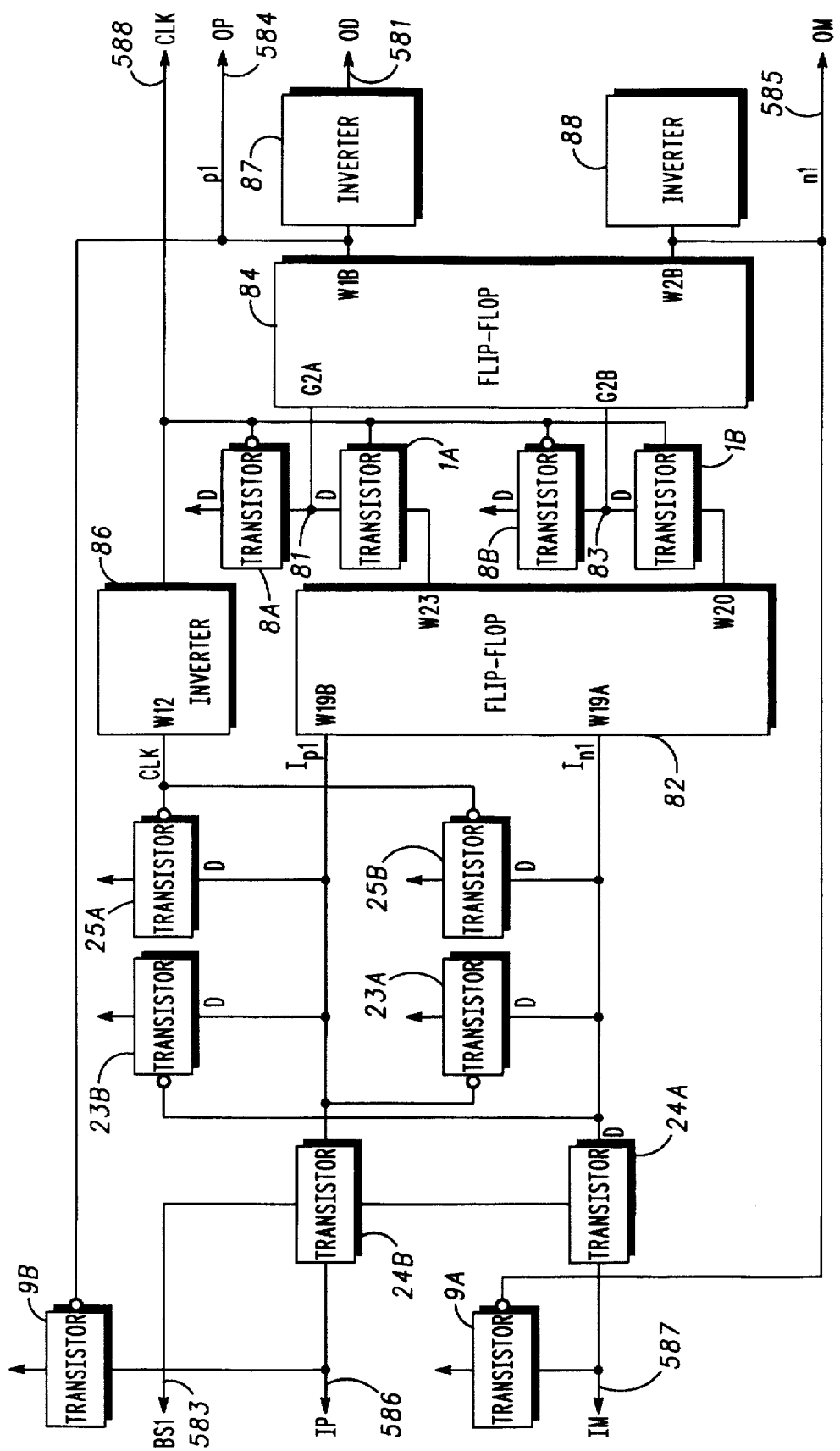
FIG. 10 is a simplified circuit diagram of a comparator as it can be used in a converter of FIGS. 9A–B.

FIG. 10 is a simplified circuit diagram of comparator 580. In FIG. 10, reference numbers 581, 584, 585, 586, 587, 588 correspond to the inputs and outputs of comparator 580 as shown in FIG. 9B. Connections to power terminal 501 (FIG. 9B) are indicated by an arrow pointing up. Comparator 580 comprises flip-flops 82, 84, inverter 86, 87, 88 and field effect transistors (FETs) 23A/B, 24A/B, 25A/B, 1A/B, 8A/B and 9A/B. Elements are wired similar to comparator 180. Reference numbers 181/581, 183/583, 184/584, 185/585, 186/586, 187/587, 188/588 and the numbers for the mentioned elements are corresponding in FIG. 3 and FIG. 10. Compared to comparator 180 of FIG. 3, inverter 88 of comparator 580 is coupled to output W2B of flip-flop 84. Output OM (585) and OP (584) are coupled to outputs W2B and W1B, respectively, of flip-flop 84. Outputs W1B and W2B are coupled to the gates of FET 9B and FET 9A, respectively. The drain-source paths of FET 9A and FET 9B are coupled between power terminal 501 and inputs IP and IM, respectively. FET 9A and 9B are referred to as hysteresis transistors because they determine the hysteresis behavior of comparator 580. This will be explained in connection with FIG. 11 and FIG. 12.

The accuracy of comparators 180, 280, 580 used in converters 100 and 500 is increased, as explained below. For further explanations, a general model of comparator 400 is introduced. Generalized comparator 400 can comprise, for example, comparators 180 and 280 and other elements coupled thereto, such as differential transistor pairs 140 and 240. Comparator 400 can also be a smaller element, such as, for example, flip-flop 82, 84 or inverter 87, 88.

Figure 11:
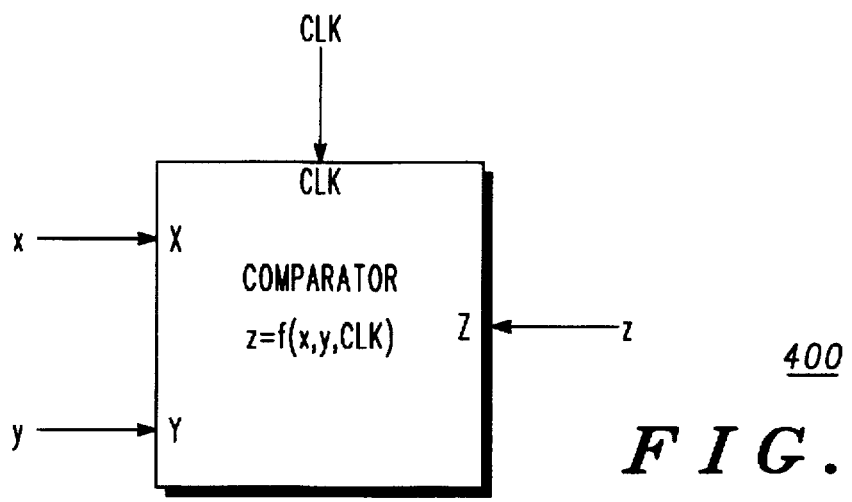
FIG. 11 shows a simplified block diagram of a comparator for comparing input signals x and y and providing a binary output signal z.

FIG. 11 shows a simplified block diagram of comparator 400. Inputs X and Y of comparator 400 are provided for receiving variable input signals x and y. Input CLK is provided for receiving clock signal CLK. Input signals x and y can be any physical unit such as a voltage, current, etc. The difference d=x−y is the differential signal d. Output Z supplies a binary output signal z, such as, for example, '1' or '0'. The output signal z is related to the input signals x, y and to CLK by the functions z=f(x,y)&CLK or z=f(d)&CLK, where '&' stands for logical 'AND'.

As for example in converter 100 of FIG. 2, comparator 400 is formed by differential transistor pair 140 and comparator 180. Input signal x is applied as capacitor voltage $V_1$ at input 141 (X) of differential transistor pair 140. Input signal y is constant and is applied as reference voltage $V_{R1}$ at input 149 (Y). The binary output signal z is available as auxiliary signal $p_1$ at output 184 (Z). In another example, comparator 400 can also be found in converter 500 comprising comparator 580 and differential transistor pair 540. Input signals x, y are the capacitor voltages $V_1$ and $V_2$ which are not constant. As a person skilled in the art will recognize, comparator 400 can be applied to other parts of the introduced circuits.

Figure 12:
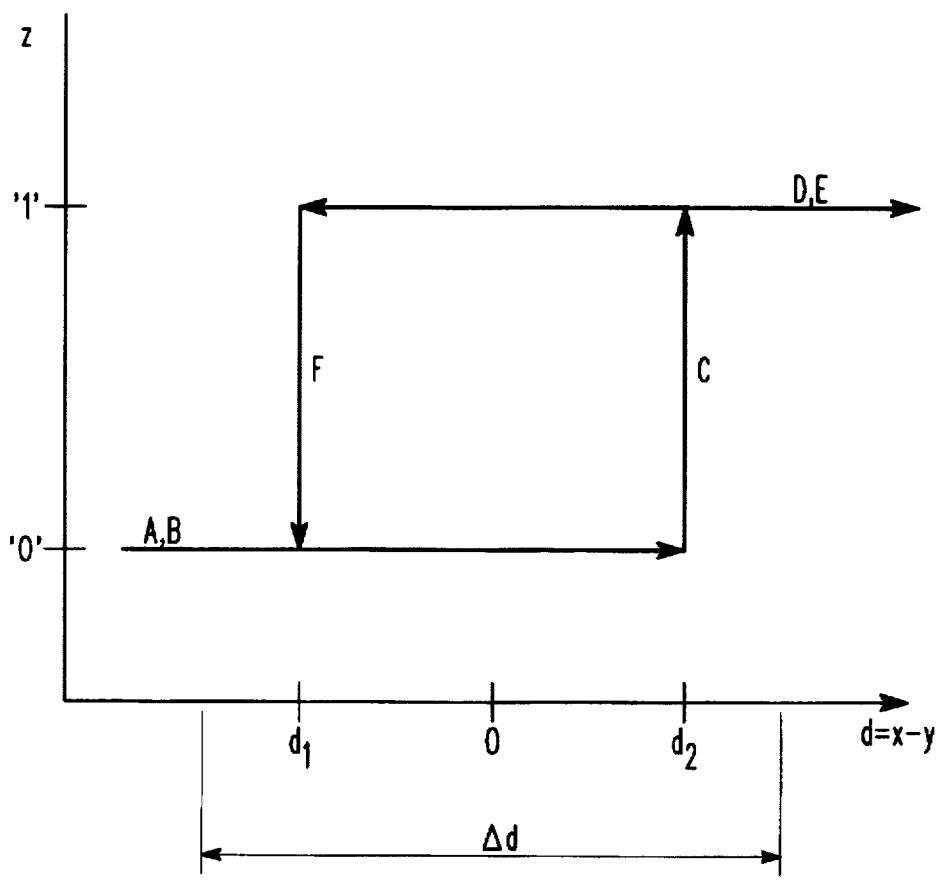
FIG. 12 shows a state diagram of the comparator of FIG. 11.

FIG. 12 is a state diagram showing comparator 400 of FIG. 11. The horizontal axis shows the differential signal d=x−y of the input signals x and y, and the vertical axis shows the binary output signal z. For the purpose of explanation, it is assumed that clock signal CLK remains in a logical '1' state. The relation between differential signal d=x−y and output signal z shows hysteresis. At step A differential signal d is negative because input signal x is smaller than input signal y. Output signal z is '0'. At step B, d is increased but remains smaller than a threshold value $d_2$. In step C, x passes y and the output signal z changes to '1'. In steps D and E, the differential signal d is increased and then decreased but stays greater than the threshold value $d_1$. Output signal z remains at '1'. When in step F, differential signal d reaches $d_1$, the output signal z returns to '0'.

For generalized comparator 400, the threshold values $d_1$ and $d_2$ can be fixed. As it can be seen in the example of FIG. 12, the threshold value $d_1$ is positive and the threshold value $d_2$ is negative. But this is not necessary. Both values can be positive or negative. For a real comparator, $d_1$ and $d_2$ are often unknown and can not be fixed. They depend on the construction and on manufacturing variations. For further explanations, it is assumed that $d_1$ and $d_2$ are located inside a tolerance band $\Delta d$.

For differential signals d outside the tolerance band $\Delta d$, the output signal z is determined and either '1' or '0'. If d is inside $\Delta d$ than z can oscillate between '0' and '1'.

In comparator 580 of FIG. 10, FETs 9A and 9B determine the hysteresis. Hysteresis of comparator 580 can be used, for example, to average out fluctuations at inputs 586, 587 caused by above mentioned element mismatches in reference banks 550 and 650.

It is known to superimpose a dither signal into an ADC circuit, e.g., from the U.S. Pat. No. 4,710,747 and the patent applications GB-2235599A-Emmett and JP-5-284033-Imamura et. al. First, the input signal x can be modified by a dither signal $e_1$. The resulting signal can be x'=x+$e_1$ or x"=x*$e_1$. Second, the input signal y can be modified by a dither signal $e_2$, so it can become, e.g., y'=y+$e_2$ or y"=y*$e_2$. Other variations for x and y are also possible and conceivable for a person skilled in the art. The dither signals $e_1$, $e_2$ have amplitudes significant smaller than the signals x or y. The signals $e_1$, $e_2$ can be generated at random or derived from signals available inside the circuits as introduced in previous drawings.

Figure 13:
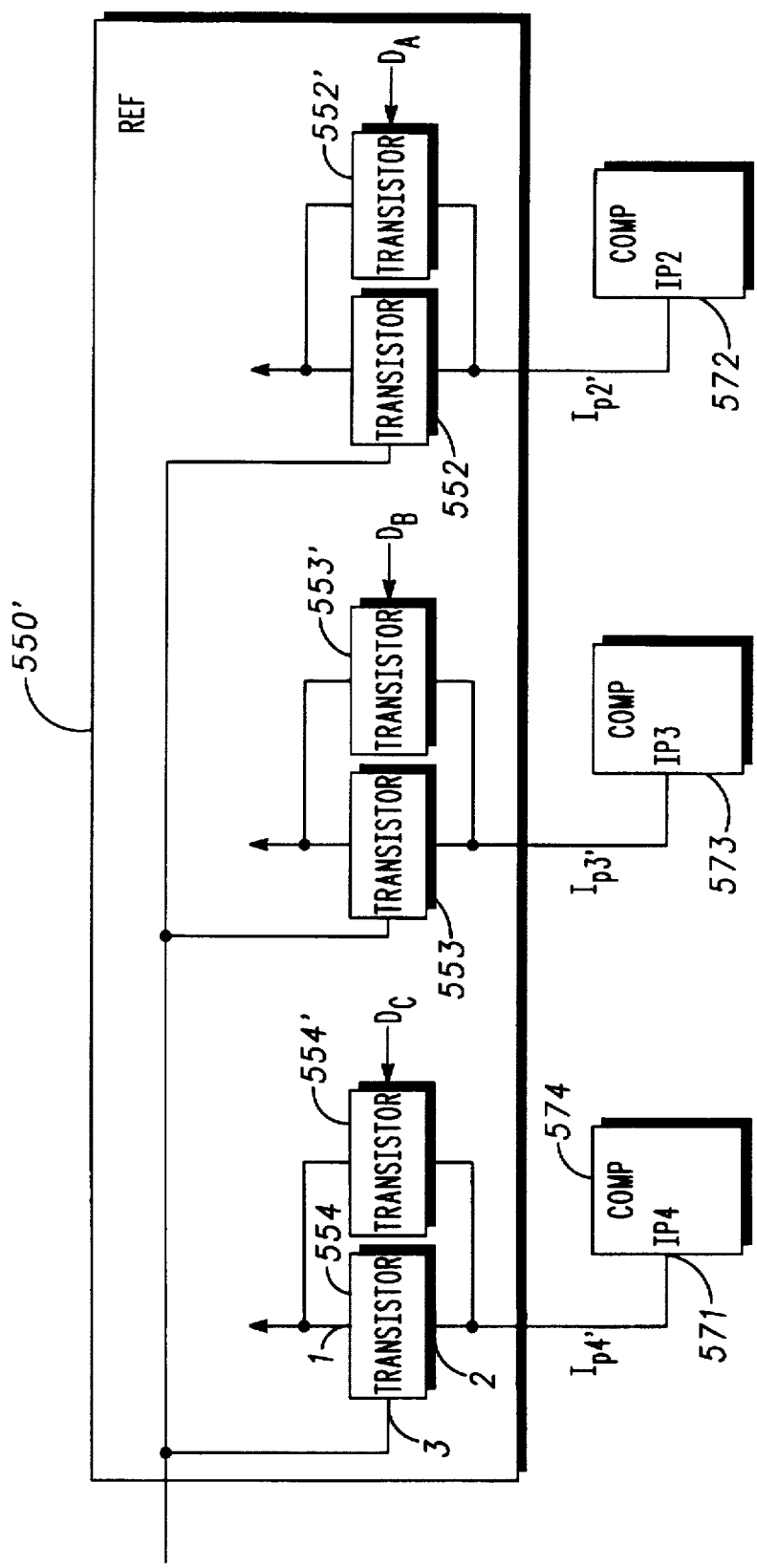
FIG. 13 is a simplified block diagram illustrating the superimposition of dither signals to currents sources in the converter of FIGS. 9A–B.

FIG. 13 is a simplified block diagram illustrating the superimposition of dither signals $D_A$, $D_B$, and $D_C$ to current sources 554, 553, 552, respectively, of reference bank 550 of comparator 500. In FIG. 13, modified reference bank 550 is denoted by primed reference number 550'. Transistors 552', 553', 554' are coupled in parallel to current sources 554, 553, 552, respectively. Transistors 552', 553', 554' have control inputs (e.g., gates) for receiving dither signals $D_A$, $D_B$, and $D_C$, respectively. Transistors 552', 553', and 554' are collectively referred to as means for superimposing dither. It is well known to a skilled person in the art how to generate single-bit digital dither signals $D_A$, $D_B$, $D_C$ in a way that they are not correlated. Other ways to add dither signals are also known. Reference bank 550' generates auxiliary currents $I_{p2}'$, $I_{p3}'$, $I_{p4}'$ (first modified current vector $I_{p2}'/I_{p3}'/I_{p4}'$) which are supplied to comparator bank 570. Accordingly, it is possible to obtain reference bank 650' which provides auxiliary currents $I_{n2}'$, $I_{n3}'$, $I_{n4}'$ (second modified current vector $I_{n2}'/I_{n3}'/I_{n4}'$).

In converter 500 of FIGS. 9A–B, the outputs of converters 580, 572, 573 and 574 are directly coupled to transistor pairs $N_1$ of feedback unit 160 and to transistor pairs $N_2$, $N_3$, $N_4$ of switch bank 510. Converter 500 can be modified by coupling dynamic matching circuits between the transistor pairs and the converters.

Figure 14:
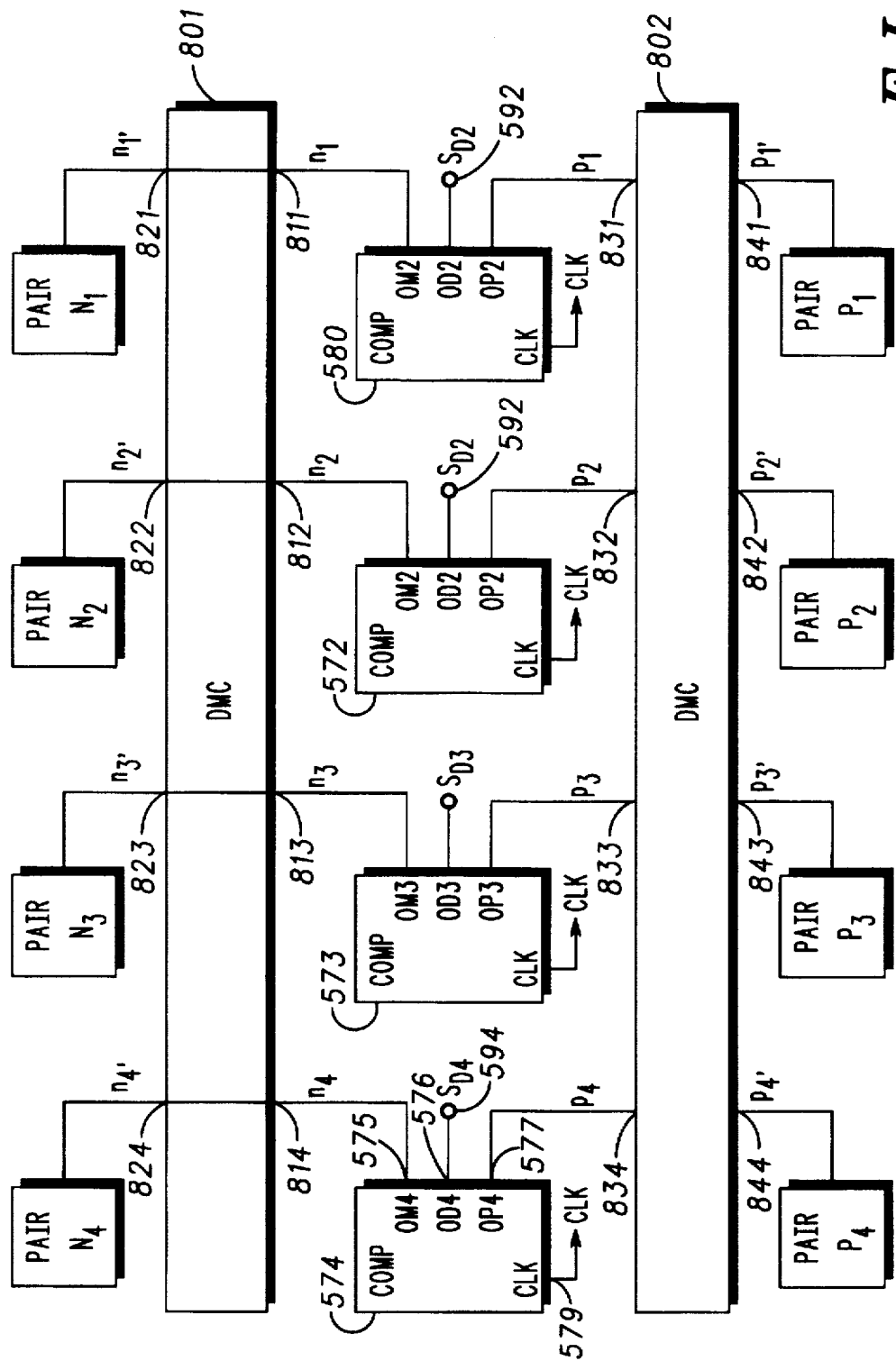
FIG. 14 is a simplified block diagram illustrating the use of dynamic matching circuits in the converter of FIGS. 9A–B.

FIG. 14 is a simplified block diagram illustrating the use of dynamic matching circuits in converter 500 of FIGS. 9A–B. FIG. 14 shows a detail of modified converter 500. This detail is denoted by reference number 500'. First dynamic matching circuit 801 (DMC 801) has inputs 811, 812, 813, and 814 coupled to outputs OM1, OM2, OM3, and OM4 (575) of comparators 580, 572, 573, and 574, respectively. DMC 801 receives digital auxiliary signals $n_1$, $n_2$, $n_3$, and $n_4$. Outputs 821, 822, 823, and 824 of DMC 801 are coupled to transistor pairs $N_1$, $N_2$, $N_3$, and $N_4$ for supplying permuted signals $n_1'$, $n_2'$, $n_3'$, and $n_4'$, respectively. Second dynamic matching circuit 802 (DMC 802) has inputs 831, 832, 833, and 834 coupled to outputs OP1, OP2, OP3, and OP4 of comparators 580, 572, 573, and 574 for receiving digital auxiliary signals $p_1$, $p_2$, $p_3$, and $p_4$, respectively. Outputs 831, 832, 833, and 834 are coupled to transistor pairs $P_1$, $P_2$, $P_3$, and $P_4$ for supplying permuted signals $p_1'$, $p_2'$, $p_3'$, and $p_4'$, respectively. According to the modification, dynamic matching circuits 801 and 802 permute digital auxiliary signals. Thereby, component mismatches can be averaged out.

For DMC 801, the numbers of signals at the '1' state at inputs 811, 812, 813, 814 equals the numbers of signals at the '1' state at outputs 821, 822, 823, 824. For DMC 802, the same principle is applicable. Compared to converter 500, the number of transistor pairs which are switched is not changed. However, their position is changed. Manufacturing variations of transistors pairs $N_i$, $P_i$ and of the current sources in reference banks 550 and 650 can be equalized.

In other words, converter 500 can comprise first dynamic matching circuit 801 which is coupled at the input side to comparator bank 570 and first comparator 580 and at the output side to switch bank 510 and feedback unit 560. DMC 801 receives first auxiliary signal $n_1$ and first digital vector $n_2/n_3/n_4$. DMC 801 permutes $n_1$, $n_2$, $n_3$, $n_4$ and provides a third digital vector $n_1'/n_2'/n_3'/n_4$ which controls first switch bank 510 and feedback unit 560.

Converter 500 can comprise second dynamic matching circuit 802 which is coupled at the input side to comparator bank 570 and first comparator 580 and at the output side to switch bank 610 and feedback unit 560. DMC 802 receives second auxiliary signal $p_1$ and second digital vector $p_2/p_3/p_4$. DMC 802 permutes $p_1$, $p_2$, $p_3$, $p_4$ and provides a fourth digital vector $p_1'/p_2/p_3/p_4$ which controls second switch bank 610 and feedback unit 560.

Figure 15:
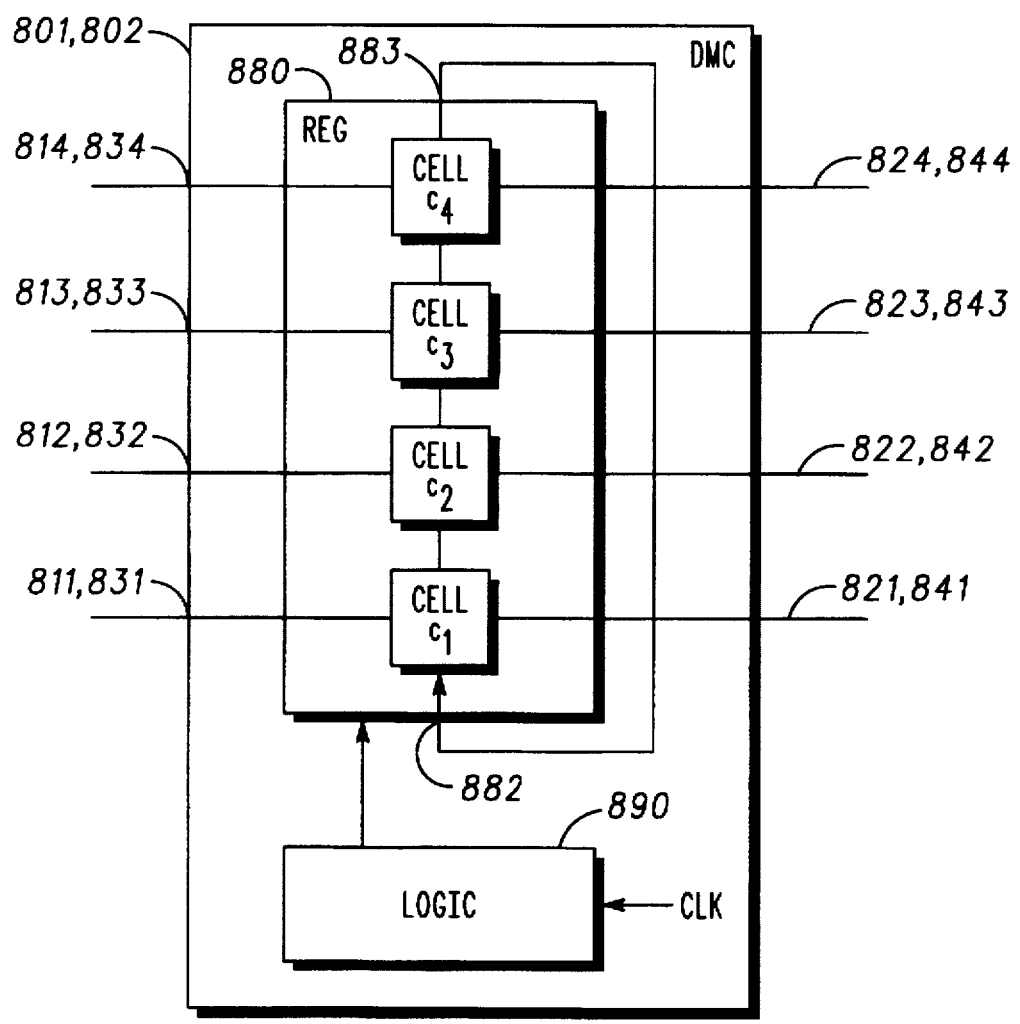
FIG. 15 is a simplified block diagram of a dynamic matching circuit of FIG. 14.

FIG. 15 is a simplified block diagram of a dynamic matching circuit. As a non-limiting example, FIG. 15 shows an embodiment of an DMC as used in the above mentioned patent application [2]. DMC 801 and DMC 802 comprise shift register 880 of storage cells $c_1$, $c_2$, $c_3$, and $c_4$. Output 883 of shift register 880 is coupled to input 882. Optionally, shift register 880 can be controlled by control logic 890 which is coupled to clock terminal 508 (FIG. 9A) for receiving CLK. Details on how to permute the signals by DMC 801 and 802 are given in [2]. Persons of skill in the art will understand that there are other ways to implement a DMC.

It will be appreciated that although only two particular embodiments of the invention has been described in detail, various modifications and improvements can be made by a person skilled in the art based on the teachings herein without departing from the scope of the present invention.

We claim:

1. A signal processing circuit comprising an analog-to-digital converter for converting a differential analog signal having a first component and a second component using an integrator for integrating said analog signal a comparator for comparing an integrated form of said analog signal to a reference signal to produce a digital signal on an output of said analog-to-digital converter which is related to said analog signal, and a feedback circuit coupled to said output for converting said digital signal to an analog feedback signal for presenting negatively to said integrator, wherein said integrator has at least a first capacitance and a second capacitance, each being implemented by MOS transistors which have drains and sources coupled to a common node and which receive said first and second components by gates, and wherein said comparator comprises at least a first comparator and a second comparator coupled to said first and second capacitance, said first and second comparator receiving said reference signal, and said feedback circuit comprising at least a first feedback unit and a second feedback unit coupled to said first and second capacitances, respectively, wherein said first feedback unit and said second feedback unit each have serially coupled transistors being responsive to digital auxiliary signals from said first comparator and said second comparator, respectively, whereby said digital auxiliary signals return to zero with a clock signal.

2. A signal processing circuit comprising an analog-to-digital converter for converting a differential analog signal having a first component and a second component using an integrator for integrating said analog signal, a comparator for comparing an integrated form of said analog signal to a reference signal to produce a digital signal on an output of said analog-to-digital converter which is related to said analog signal, and a feedback circuit coupled to said output for converting said digital signal to an analog feedback signal for presenting negatively to said integrator, wherein said integrator has at least a first capacitance and a second capacitance, each being implemented by MOS transistors which have drains and sources coupled to a common node and which receive said first and second components by gates, and wherein said comparator comprises at least a first comparator and a second comparator coupled to said first and second capacitance, said first and second comparator receiving said reference signal, and said feedback circuit comprising at least a first feedback unit and a second feedback unit coupled to said first and second capacitances, respectively, said signal processing circuit further comprising:

a first reference bank receiving said first component and a second reference bank receiving said second component, for providing a plurality of current pairs responsive to said analog signal;

a comparator bank having a plurality of comparators receiving said current pairs from said reference banks; and a first switch bank and a second switch bank coupled to said first capacitance and to said second capacitance, respectively, for charging and discharging said capacities in response to auxiliary digital signals from said comparator bank.

3. An analog-to-digital converter for converting a differential analog signal having a first component and a second component into a digital signal comprising at least a first digital signal component, a second digital signal component, and a third digital signal component, said converter comprising:

a first MOS transistor capacitance and a second MOS transistor capacitance with common main electrodes which are coupled together either to a first power terminal or to a second power terminal, said first MOS transistor capacitance receiving said first component by a first control electrode and integrating said first component to a first capacitor charge, said second MOS transistor capacitance receiving said second component by a second control electrode and integrating said second component to a second capacitor charge;

a first comparator comparing said first capacitor charge and said second capacitor charge and providing said first digital signal component;

a first reference bank providing a first current vector in response to said first component;

a second reference bank providing a second current vector in response to said second component;

a comparator bank receiving said first current vector and said second current vector, said comparator bank providing a first digital vector and a second digital vector and providing at least said second digital signal component and said third digital signal component; and a first switch bank and a second switch bank charging or discharging said first MOS transistor capacitance and said second MOS transistor capacitance in response to said first digital vector and said second digital vector, respectively.

4. The analog-to-digital converter of claim 3 wherein said first comparator provides a first auxiliary signal and a second auxiliary signal for controlling a feedback unit coupled to said first MOS transistor capacitance and to said second MOS transistor capacitance, said feedback unit charging said first MOS transistor capacitance and discharging said second MOS transistor capacitance or charging said second MOS transistor capacitance and discharging said first MOS transistor capacitance.

5. The analog-to-digital converter of claim 3 wherein said comparator bank comprises at least a second comparator and a third comparator, and wherein said first comparator, said second comparator, and said third comparator are being clocked by a clock signal and wherein said first auxiliary signal and a second auxiliary signal and the signals of said first digital vector and of said second digital vector return to zero with said clock signal.

6. The analog-to-digital converter of claim 3 wherein said first comparator shows hysteresis behavior which is determined by hysteresis transistors which are part of said first comparator.

7. The analog-to-digital converter of claim 3 wherein said first reference bank and said second reference bank comprise means for superimposing dither so that said first reference bank and said second reference bank provide a first modified current vector and a second modified current vector, respectively.

8. The analog-to-digital converter of claim 3 further comprising a first dynamic matching circuit coupled between said comparator bank for receiving said first digital vector said first dynamic matching circuit providing a third digital vector which controls said first switch bank, thus averaging component mismatches.

9. The analog-to-digital converter of claim 3 further comprising a second dynamic matching circuit coupled between said comparator bank for receiving said second digital vector, said second dynamic matching circuit providing a fourth digital vector which controls said second switch bank, thus averaging component mismatches.

10. An analog-to-digital converter for converting a differential analog signal having a first component and a second component into a digital signal, comprising:
   a first MOS transistor and a second MOS transistor having their sources and drains coupled together and to a first node, said first MOS transistor receiving said first component at a first gate and, said second MOS transistor receiving said second component at a second gate;
   a first comparator coupled to said first gate and a second comparator coupled to said second gate, said first comparator provides a first auxiliary signal and said digital signal, said second comparator provides a second auxiliary signal; and
   a first feedback unit controlled by said first auxiliary signal and coupled to said first gate and a second feedback unit controlled by said second auxiliary signal and coupled to said second gate, said feedback units charging and discharging said first and second gates in response to said auxiliary signals.

11. The analog-to-digital converter of claim 10 wherein said first feedback unit and said second feedback unit each comprise serially coupled first and second transistors, said first transistors receiving said auxiliary signals and said second transistors receiving a reference signal.

12. The analog-to-digital converter of claim 10 wherein said first comparator and said second comparator are being clocked by a clock signal and wherein said first auxiliary signal and said second auxiliary signal return to zero with said clock signal going to zero.

13. A method for converting a differential analog signal having a first component and a second component into a digital signal, said digital signal comprising at least a first digital signal component, a second digital signal component, and a third digital signal component, said method comprising the steps of:
   integrating said first component by a first gate capacitance and said second component by a second gate capacitance, respectively, in respect to a common source-drain reference line, thereby providing a first capacitor charge and a second capacitor charge, respectively;
   comparing said first capacitor charge and said second capacitor charge by a first comparator, thereby providing said first digital signal component;
   providing a first current vector in response to said first component by a first reference bank;
   providing a second current vector in response to said second component by a second reference bank;
   receiving said first current vector and said second current vector by a comparator bank, said comparator bank providing a first digital vector and a second digital vector and providing at least said second digital signal component and said third digital signal component; and
   charging or discharging said first capacitance and said second capacitance by a first switch bank and by a second switch bank in response to said first digital vector and said second digital vector, respectively.

14. A converter receiving an analog signal having a first analog component and a second analog component and providing a digital signal, said converter comprising:
   a first transistor and a second transistor having main electrodes coupled together to a first reference potential, a gate of said first transistors receiving said first analog component and a gate of said second transistor receiving said second analog component;
   a first feedback unit with third and fourth transistors coupled between said gate of said first transistor and a second reference potential;
   a second feedback unit with fifth and sixth transistors coupled between said gate of said second transistor and a third reference potential;
   a first comparator having a first input coupled to said gate of said first transistor and having a second input receiving a reference signal, said first comparator controlling said third and fourth transistors of said first feedback unit by a first digital signal pair with complementary return-to-zero components; and
   a second comparator having a third input coupled to said gate of said second transistor and having a fourth input receiving said reference signal, said second comparator controlling said fifth and sixth transistors of said second feedback unit by a second digital signal pair with return-to-zero components.

15. The converter of claim 14 wherein said third and fourth transistors are serially coupled to said gate of said first transistor via further transistors, and said fifth and sixth transistors are serially coupled to said gate of said second transistor via still further transistors, said further transistors and said still further transistors receiving a reference voltage.

16. The converter of claim 14 wherein said first and second transistors are MOS transistors.

* * * * *